(12) United States Patent
Yanagita et al.

(10) Patent No.: US 10,741,599 B2
(45) Date of Patent: Aug. 11, 2020

(54) IMAGE PICK-UP APPARATUS

(71) Applicant: SONY SEMICONDUCTOR SOLUTIONS CORPORATION, Kanagawa (JP)

(72) Inventors: Takeshi Yanagita, Tokyo (JP); Taichi Natori, Kanagawa (JP); Hirotsugu Takahashi, Kanagawa (JP); Shunsuke Maruyama, Kanagawa (JP); Yasushi Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 52 days.

(21) Appl. No.: 15/768,378

(22) PCT Filed: Oct. 12, 2016

(86) PCT No.: PCT/JP2016/080220
§ 371 (c)(1),
(2) Date: Apr. 13, 2018

(87) PCT Pub. No.: WO2017/073322
PCT Pub. Date: May 4, 2017

(65) Prior Publication Data
US 2018/0308883 A1    Oct. 25, 2018

(30) Foreign Application Priority Data

Oct. 26, 2015 (JP) .................................. 2015-209533

(51) Int. Cl.
*H01L 27/146* (2006.01)
*H04N 5/355* (2011.01)
*H04N 5/3745* (2011.01)

(52) U.S. Cl.
CPC .... *H01L 27/1463* (2013.01); *H01L 27/14605* (2013.01); *H01L 27/14621* (2013.01);
(Continued)

(58) Field of Classification Search
CPC ......... H01L 27/14629; H01L 27/14605; H01L 27/14621; H01L 27/1463; H01L 27/14645;
(Continued)

(56) References Cited

U.S. PATENT DOCUMENTS

2009/0314928 A1  12/2009  Parks
2011/0175981 A1   7/2011  Lai
(Continued)

FOREIGN PATENT DOCUMENTS

EP    1435662     7/2004
JP    H03-117281  5/1991
(Continued)

OTHER PUBLICATIONS

International Search Report and Written Opinion prepared by the European Patent Office dated Jan. 12, 2017, for International Application No. PCT/JP2016/080220.
(Continued)

Primary Examiner — Hrayr A Sayadian
(74) Attorney, Agent, or Firm — Sheridan Ross P.C.

(57) ABSTRACT

Imaging devices and electronic apparatuses incorporating imaging devices or image pick-up elements are provided. An imaging device as disclosed can include a substrate, a first opto-electronic converter having a first area formed in the substrate, and a second opto-electronic converter having a second area formed in the substrate. The first area is larger than the second area. In addition, a light blocking wall can extend from a first surface of the substrate such that at least a portion of the light blocking wall is between the first opto-electronic converter and the second opto-electronic converter.

18 Claims, 26 Drawing Sheets

(52) U.S. Cl.
CPC .. *H01L 27/14623* (2013.01); *H01L 27/14629* (2013.01); *H01L 27/14645* (2013.01); *H04N 5/35563* (2013.01); *H04N 5/37452* (2013.01); *H01L 27/14607* (2013.01); *H01L 27/14627* (2013.01)

(58) Field of Classification Search
CPC ......... H01L 27/14623; H01L 27/14607; H01L 27/14627; H04N 5/37452; H04N 5/35563
USPC ....................................................... 257/292
See application file for complete search history.

(56) References Cited

U.S. PATENT DOCUMENTS

| | | | |
|---|---|---|---|
| 2011/0228149 A1 | 9/2011 | Naruse | |
| 2014/0253767 A1 | 9/2014 | Kato | |
| 2014/0346628 A1 | 11/2014 | Okazaki | |
| 2015/0084144 A1 | 3/2015 | Suzuki | |
| 2019/0252426 A1* | 8/2019 | Lee | H01L 27/1464 |

FOREIGN PATENT DOCUMENTS

| | | |
|---|---|---|
| JP | H05-175471 | 7/1993 |
| JP | H09-162381 | 6/1997 |
| JP | H10-074926 | 3/1998 |
| JP | 2004-193762 | 7/2004 |
| JP | 2005-086082 | 3/2005 |
| JP | 2005-086083 | 3/2005 |
| JP | 2007-135200 | 5/2007 |
| JP | 2010-109295 | 5/2010 |
| JP | 2011-526105 | 9/2011 |
| JP | 2011-199643 | 10/2011 |
| JP | 2011-243996 | 12/2011 |
| JP | 2012-009539 | 1/2012 |
| JP | 2012-038981 | 2/2012 |
| JP | 2013-175494 | 9/2013 |
| JP | 2014-175553 | 9/2014 |
| JP | 2014-229810 | 12/2014 |
| JP | 2015-065270 | 4/2015 |
| JP | 2015-153859 | 8/2015 |

OTHER PUBLICATIONS

Official Action (no English translation available) for Japanese Patent Application No. 2015-209533, dated Aug. 13, 2019, 6 pages.
Official Action (no English translation available) for Japanese Patent Application No. 2015-209533, dated Feb. 27, 2020, 4 pages.

* cited by examiner

IMAGE PICK-UP APPARATUS

CROSS REFERENCE TO RELATED APPLICATIONS

This application is a national stage application under 35 U.S.C. 371 and claims the benefit of PCT Application NO. PCT/JP2016/080220 having an international filing date of 12 Oct. 2016, which designated the United States, which PCT application claimed the benefit of Japanese Priority Patent Application JP 2015-209533 filed on Oct. 26, 2015, the disclosures of each of which are incorporated herein by reference.

TECHNICAL FIELD

The present technology relates to an image pick-up apparatus. In detail, the present technology relates to an image pick-up apparatus capable of extending the dynamic range of the image pick-up apparatus.

BACKGROUND ART

There are technologies to extend the dynamic range of image pick-up apparatuses in various methods. For example, a time-division method in which images are taken with different sensitivities at different times so that the images taken at the different times are synthesized is known.

Additionally, for example, a space-division method in which light receiving elements with different sensitivities are provided in an image pick-up apparatus so that synthesizing a plurality of images taken with the light receiving elements, respectively, extends the dynamic range of the image pick-up apparatus is known (for example, see Patent Literature 1 and 2).

Furthermore, for example, an in-pixel memory method in which a memory in which the charge overflowing from a photodiode is accumulated is provided on each pixel in an image pick-up apparatus so that the amount of charge accumulated in an exposure period is increased and the increase extends the dynamic range of the image pick-up apparatus (for example, see Patent Literature 3).

CITATION LIST

Patent Literature

PTL 1: Japanese Patent No. 3071891
PTL 2: Japanese Patent Application Laid-open No. 2006-253876
PTL 3: Japanese Patent No. 4317115

SUMMARY OF INVENTION

Technical Problem

Increasing the number of divided times in the time division method or increasing the number of divided spaces in the space division method can extend the dynamic range of an image pick-up apparatus. On the other hand, however, the increase in number of divided times or divided spaces degrades the quality of images, for example, due to the occurrence of an artifact or the decrease in resolution.

Additionally, the limit of the memory capacity limits the extension of the dynamic range in the in-pixel memory method.

In light of the foregoing, it is desirable to extend the dynamic range of an image pick-up apparatus without degrading the quality of images.

Solution to Problem

An image pick-up apparatus according to an aspect of the present technology includes: a pixel array unit, a plurality of unit pixels being arranged in the pixel array unit, the unit pixels including a first opto-electronic converter, and a second opto-electronic converter having a sensitivity lower than a sensitivity of the first opto-electronic converter, the second opto-electronic converter including a light-blocking film formed on a side of the second opto-electronic converter from which light enters the second opto-electronic converter.

A lens used to collect light entering the second opto-electronic converter may not be formed on the second opto-electronic converter.

A light-blocking wall used to prevent light from leaking from an opto-electronic converter into opto-electronic converters next to the opto-electronic converter may be provided between the opto-electronic converters.

The light-blocking film may have a slit.

The directions in which slits are formed on light-blocking films formed on the adjacent second opto-electronic converters may be different.

The image pick-up apparatus may be a backside-illumination image sensor.

The image pick-up apparatus may be a front-side-illumination image sensor.

The light-blocking film may be formed on a lower or upper side of a wiring layer formed on the second opto-electronic converter.

The light-blocking film may be an amorphous silicon film, a polysilicon film, a Ge film, a GaN film, a CdTe film, a GaAs film, an InP film, a CuInSe2 film, Cu2S, a CIGS film, a non-conductive carbon film, a black resist film, an organic opto-electronic conversion film, or a metal film.

In the image pick-up apparatus according to an aspect of the present technology, a unit pixel on a pixel array unit on which a plurality of unit pixels is arranged includes a first opto-electronic converter and a second opto-electronic converter having a sensitivity lower than the sensitivity of the first opto-electronic converter. A light-blocking film is formed on a side of the second opto-electronic converter from which light enters the second opto-electronic converter.

Advantageous Effects of Invention

According to an aspect of the present technology, the dynamic range of an image pick-up apparatus can be extended without the degradation of the quality of images.

According to embodiments of the present disclosure, an imaging device is provided. The imaging device can include a substrate, a first opto-electronic converter having a first area formed in the substrate, and a second opto-electronic converter having a second area formed in the substrate, wherein the first area is larger than the second area. In addition, a trench extends from a first surface of the substrate, such that at least a portion of the trench is between the first opto-electronic converter and the second opto-electronic converter.

In accordance with further embodiments of the present disclosure, an imaging device is provided. The imaging device includes a substrate, a first opto-electronic converter, and a second opto-electronic converter. The second opto-electronic converter has a sensitivity that is lower than a sensitivity of the first opto-electronic converter. In addition, a trench extends from a first surface of the substrate such that at least a portion of the trench is between the first opto-electronic converter and the second opto-electronic converter.

In accordance with still further embodiments of the present disclosure, an electronic apparatus is provided. The apparatus includes an optical system, an image pick-up element that receives light from the optical system, and a digital signal processor that processes signals received from the imagine pick-up element. The image pick-up element includes a substrate, a first opto-electronic converter having a first area formed in the substrate, and a second opto-electronic converter having a second area formed in the substrate, wherein the first area is larger than the second area. The image pick-up element also includes a light-blocking wall that extends from a first surface of the substrate, wherein at least a portion of the light-blocking wall is between the first opto-electronic converter and the second opto-electronic converter.

Note that the effects of the present disclosure are not necessary limited to the effects described above and can be any one of the effects described herein.

DESCRIPTION OF EMBODIMENTS

The modes for carrying out the present technology (hereinafter, referred to as embodiments) will be described hereinafter. Note that the embodiments will be described in the following order.

1. Image Pick-up Apparatus Using Present Technology
2. Configuration of Unit Pixel (First to Sixteenth Configurations)
3. Arrangement of First and Second Opto-electronic Converters
4. Exemplary Variations
5. Exemplary uses of Image Pick-up Apparatus <Image Pick-Up Apparatus Using Present Technology>

Figure 1:
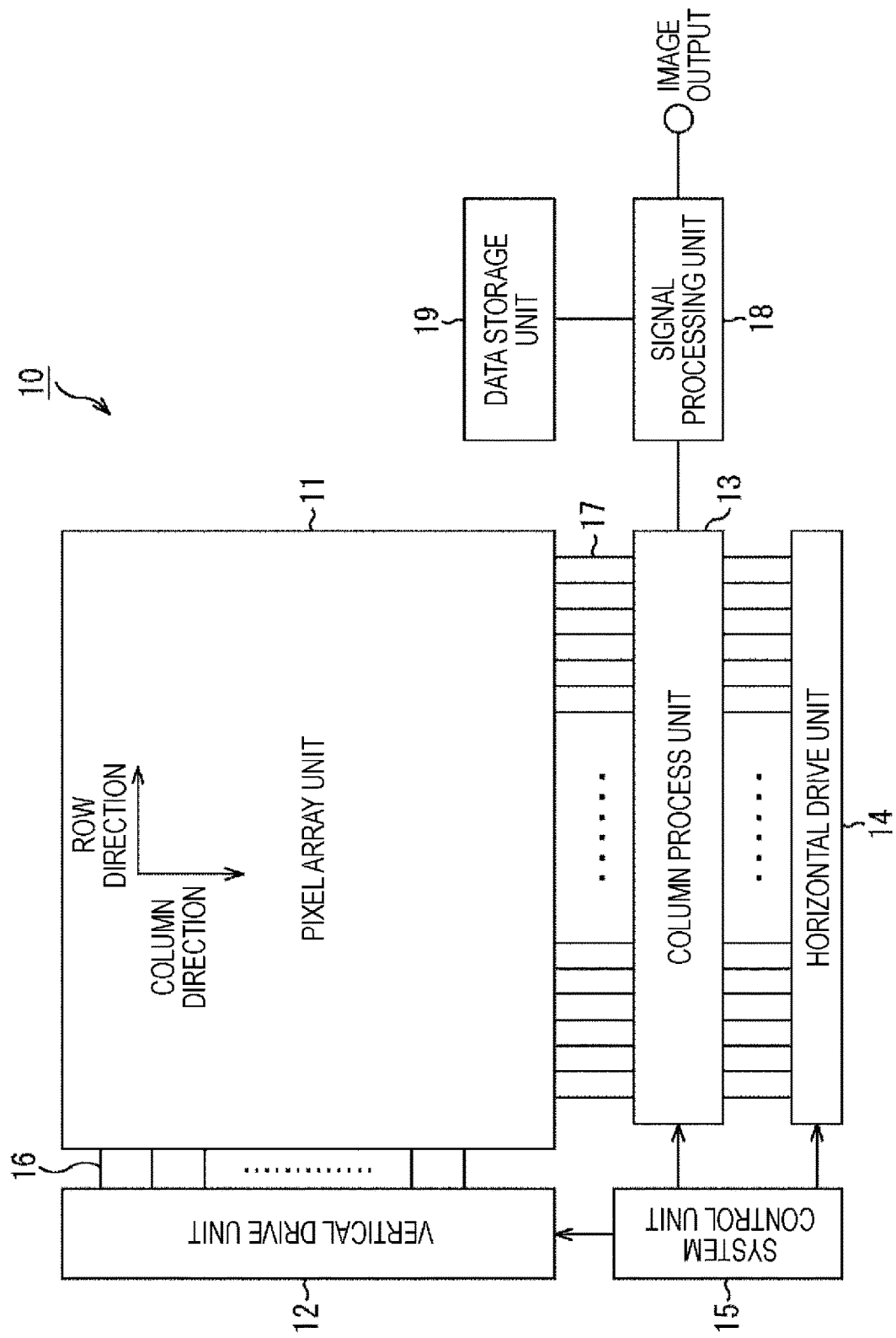
FIG. 1 is a schematic system configuration diagram of a CMOS image sensor using an embodiment of the present technology.

FIG. 1 is a schematic system configuration diagram of a CMOS image sensor that is an image pick-up apparatus using the present technology, for example, a pick-up apparatus using an X-Y address system. In this example, the CMOS image sensor is an image sensor applying or partially using a CMOS process.

A CMOS image sensor 10 according to the present exemplary application includes a pixel array unit 11 formed on a semiconductor substrate (chip) (not illustrated), and a peripheral circuit unit integrated with the pixel array unit 11 on the same semiconductor substrate. The peripheral circuit unit includes, for example, a vertical drive unit 12, a column processing unit 13, a horizontal drive unit 14, and a system control unit 15.

The CMOS image sensor 10 further includes a signal processing unit 18, and a data storage unit 19. The signal processing unit 18 and the data storage unit 19 can be mounted on the same substrate on which the CMOS image sensor 10 is mounted, or can be placed on a different substrate from the substrate on which the CMOS image sensor 10 is mounted. Additionally, the process that each of the signal processing unit 18 and the data storage unit 19 performs can be processed by an external signal processing unit provided on a different substrate from the substrate on which the CMOS image sensor 10 is mounted, such as a Digital Signal Processor (DSP) circuit or by software.

In the pixel array unit 11, unit pixels (hereinafter, sometimes referred to merely as "pixels") are arranged in a row direction and a column direction, in other words, two-dimensionally arranged in rows and columns. The unit pixel includes an opto-electronic converter that generates and accumulates the charge corresponding to the amount of light that the opto-electronic converter receives. In this example, the row direction is a direction in which pixels are arranged in a pixel row (namely, a horizontal direction), and the column direction is a direction in which pixels are arranged in a pixel column (namely, a vertical direction). The concrete configuration of the circuit of the unit pixel and the detailed configuration of the unit pixel will be described below.

In the pixel array unit 11, pixel drive lines 16 are distributed to the pixel rows in the row direction, respectively, and vertical signal lines 17 are distributed to pixel columns in the column direction, respectively, in the pixel arrangement in rows and columns. The pixel drive line 16 transmits a drive signal used for the drive to read a signal from a pixel. FIG. 1 illustrates the pixel drive line 16 as a wire. However, the number of wires is not limited to one. First ends of the pixel drive lines 16 are connected to output terminals of the vertical drive unit 12 that corresponds to the rows, respectively.

The vertical drive unit 12 includes a shift register or an address decoder, and drives the pixels in the pixel array unit 11, for example, simultaneously or row by row. In other words, the vertical drive unit 12 cooperates with a system control unit 15 that controls the vertical drive unit 12 so as to work as a drive unit that controls the operation of each pixel in the pixel array unit 11. The illustration of the concrete configuration of the vertical drive unit 12 is omitted. However, the vertical drive unit 12 generally includes two scanning systems; a readout scanning system, and a discharge scanning system.

The readout scanning system sequentially selects and scans the unit pixels in the pixel array unit 11 row by row so as to read signals from the unit pixels. The signal read from a unit pixel is an analog signal. The discharge scanning system scans a row in discharge scanning the exposure period earlier than the time when the readout scanning system reads and scans the row in readout scanning.

The discharge scanning by the discharge scanning system discharges unnecessary charge from the opto-electronic converters of the unit pixels in the read row. This discharge resets the opto-electronic converters. Then, the discharge of the unnecessary charge (the resetting) by the discharge scanning system causes so-called electronic shutter operation. In this example, the electronic shutter operation is the operation in which the charge in the opto-electronic converter is discharged and exposure is newly started (the accumulation of charge is started).

The signal read in a readout operation by the readout scanning system corresponds to the amount of light received in and after the readout operation or electronic shutter operation immediately before the readout operation. Then, the period between the readout timing by the readout operation immediately before the current readout operation or the discharge timing by the electronic shutter operation immediately before the current readout operation and the readout timing by the current readout operation is the period of exposure of charge in the unit pixel.

A signal is output from each unit pixel in the pixel row selected and scanned by the vertical drive unit 12. The signal is input via each vertical signal line 17 pixel column by pixel column to the column processing unit 13. The column processing unit 13 processes the signals output via the vertical signal line 17 from the pixels in the selected row in the pixel array unit 11 pixel column by pixel column in a predetermined signal process, and temporarily stores the pixel signals after the signal process.

Specifically, the column processing unit 13 performs at least a noise removal process, for example, a Correlated Double Sampling (CDS) process, or a Double Data Sampling (DDS) process as the signal process. For example, the CDS process removes reset noise or fixed pattern noise specific to a pixel such as the variations in the threshold of the amplification transistor in the pixel. In addition to the noise removal process, the column processing unit 13 can have, for example, an analog-digital (AD) conversion function so that the column processing unit 13 can convert an analog pixel signal into a digital signal and output the digital signal.

The horizontal drive unit 14 includes, for example, a shift register and an address decoder so as to sequentially select a unit circuit corresponding to the pixel column of the column processing unit 13. This selection and scanning by the horizontal drive unit 14 sequentially outputs the pixel signals processed unit circuit by unit circuit in the signal process by the column processing unit 13.

The system control unit 15 includes, for example, a timing generator that generates various timing signals so as to control the drive, for example, of the vertical drive unit 12, the column processing unit 13, and the horizontal drive unit 14 on the basis of various times generated by the timing generator.

The signal processing unit 18 includes at least an arithmetic process function so as to process the pixel signal output from the column processing unit 13 in various signal processes including the arithmetic process. The data storage unit 19 temporarily stores the data necessary for a signal process so that the signal processing unit 18 performs the signal process.

<Configuration of Circuit of Unit Pixel 100>

Figure 2:
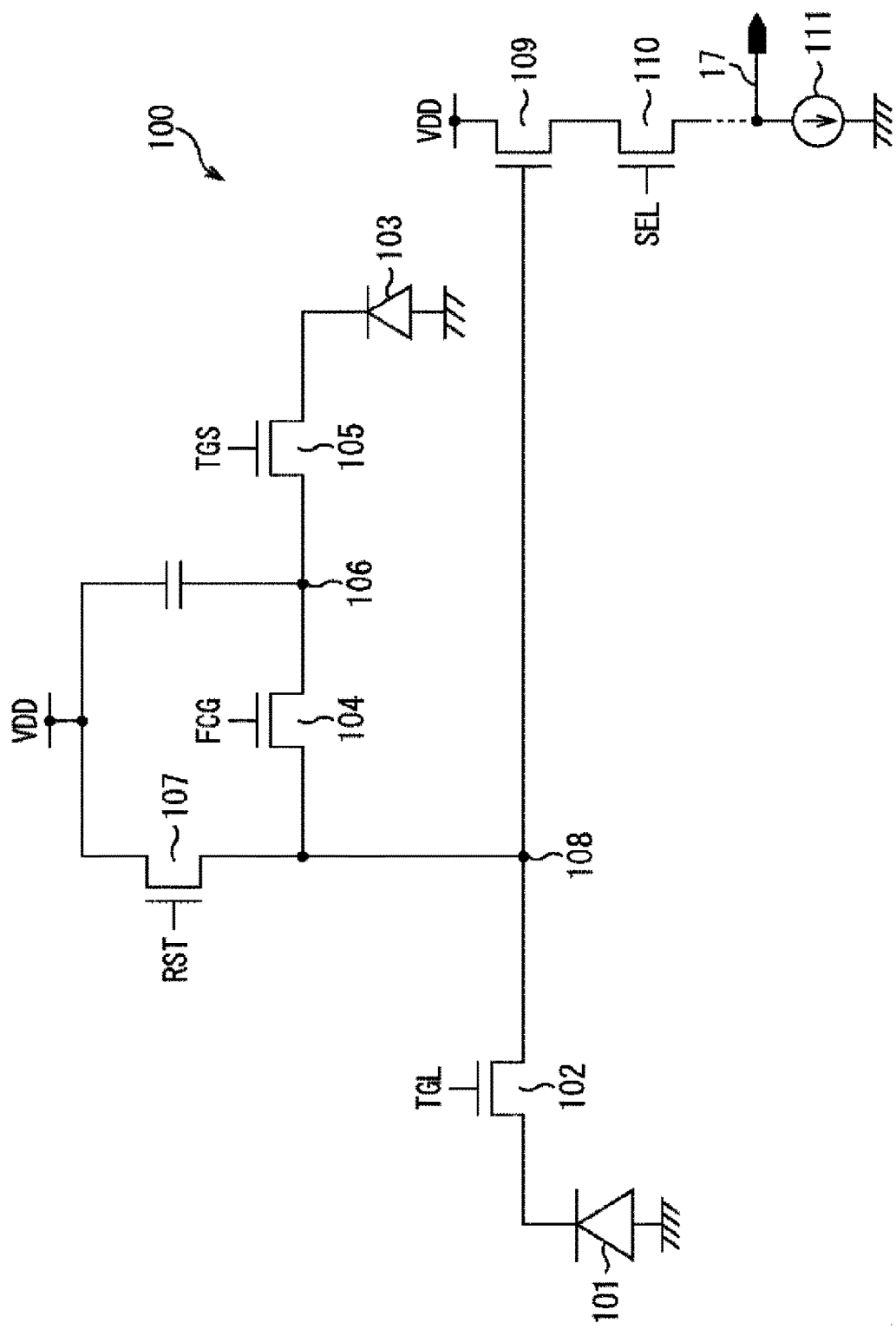
FIG. 2 is a circuit diagram of an exemplary configuration of a unit pixel.

FIG. 2 is a circuit diagram illustrating the configuration of the unit pixel 100 placed in the pixel array unit 11 in FIG. 1.

The unit pixel 100 includes a first opto-electronic converter 101, a first transfer gate unit 102, a second opto-electronic converter 103, a second transfer gate unit 104, a third transfer gate unit 105, a charge accumulation unit 106, a reset gate unit 107, a floating diffusion (FD) unit 108, an amplification transistor 109, and a selection transistor 110.

Additionally, the unit pixel 100 is wired with a plurality of drive lines as the pixel drive lines 16 illustrated in FIG. 1, for example pixel row by pixel row. Then, various drive signals TGL, TGS, FCG, RST, and SEL are supplied via the drive lines from the vertical drive unit 12 illustrated in FIG. 1. These drive signals are a pulse signal that is in an active state at a high level (for example, the power-supply voltage VDD) and is in a non-active state at a low level (for example, negative potential) because each transistor of the unit pixel 100 is an NMOS transistor.

The first opto-electronic converter 101 includes, for example, a PN-junction photodiode. The first opto-electronic converter 101 generates and accumulates charge corresponding to the amount of light that the first opto-electronic converter 101 receives.

The first transfer gate unit 102 is connected between the first opto-electronic converter 101 and the FD unit 108. The drive signal TGL is applied to the gate electrode of the first transfer gate unit 102. When the drive signal TGL is turned into the active state, the first transfer gate unit 102 becomes conductive so that the charge accumulated in the first opto-electronic converter 101 is transferred to the FD unit 108 via the first transfer gate unit 102.

The second opto-electronic converter 103 includes, for example, a PN-junction photodiode, similarly to the first opto-electronic converter 101. The second opto-electronic converter 103 generates and accumulates the charge corresponding to the amount of light that the second opto-electronic converter 103 receives.

In comparison between the first opto-electronic converter 101 and the second opto-electronic converter 103, the light-receiving surface of the first opto-electronic converter 101 has a larger area and a higher sensitivity than the area and sensitivity of the second opto-electronic converter 103. As described above, the unit pixel 100 includes two opto-electronic converters having different sensitivities. In other words, the first opto-electronic converter 101 works as a high-sensitivity pixel while the second opto-electronic converter 103 works as a low-sensitivity pixel.

The second transfer gate unit 104 is connected between the charge accumulation unit 106 and the FD unit 108. The drive signal FCG is applied to the gate electrode of the second transfer gate unit 104. When the drive signal FCG is turned into the active state, the second transfer gate unit 104 becomes conductive so that the potential well of the charge accumulation unit 106 and the potential well of the FD unit 108 are bound or electrically connected to one another.

The third transfer gate unit 105 is connected between the second opto-electronic converter 103 and the charge accumulation unit 106. The drive signal TGS is applied to the gate electrode of the third transfer gate unit 105. When the drive signal TGS is turned into the active state, the third transfer gate unit 105 becomes conductive so that the charge accumulated in the second opto-electronic converter 103 is transferred via the third transfer gate unit 105 to the charge accumulation unit 106 or a region in which the potential well of the charge accumulation unit 106 and the potential well of the FD unit 108 are bound or electrically connected to one another.

Additionally, the potential well is slightly deeper at the lower part of the gate electrode of the third transfer gate unit 105 so as to form an overflow path through which the charge exceeding the amount of charge with which the second opto-electronic converter 103 is saturated and overflowing from the second opto-electronic converter 103 is transferred to the charge accumulation unit 106. Note that the overflow path formed on the lower part of the gate electrode of the third transfer gate unit 105 is referred to merely as the overflow path of the third transfer gate unit 105.

The charge accumulation unit 106 includes, for example, a capacitor, and is connected between the second transfer gate unit 104 and the third transfer gate unit 105. The counter electrode of the charge accumulation unit 106 is connected between the charge accumulation unit 106 and the power-supply source VDD that supplies a power-supply voltage VDD. The charge accumulation unit 106 accumulates the charge transferred from the second opto-electronic converter 103.

The reset gate unit 107 is connected between the power-supply source VDD and the FD unit 108. The drive signal RST is applied to the gate electrode of the reset gate unit 107. When the drive signal RST is turned into the active state, the reset gate unit 107 becomes conductive so that the potential of the FD unit 108 is reset into the level of the power-supply voltage VDD.

The FD unit 108 converts the charge into a voltage signal in charge-voltage conversion and outputs the voltage signal.

The gate electrode of the amplification transistor 109 is connected to the FD unit 108 while the drain electrode of the amplification transistor 109 is connected to the power-supply source VDD. The gate electrode and the drain electrode work as an input unit of the readout circuit that reads the charge retained in the FD unit 108, namely, a so-called source follower circuit. In other words, the source electrode of the amplification transistor 109 is connected via the selection transistor 110 to the vertical signal line 17, and thus the amplification transistor 109 forms the source follower circuit together with the constant current source 111 connected to a first end of the vertical signal line 17.

The selection transistor 110 is connected between the source electrode of the amplification transistor 109 and the vertical signal line 17. The selection signal SEL is applied to the gate electrode of the selection transistor 110. When the selection signal SEL is turned into the active state, the selection transistor 110 is conductive so that the unit pixel 100 is selected. Thus, the pixel signal is output from the amplification transistor 109 via the selection transistor 110 to the vertical signal line 17.

Note that the fact that each drive signal is turned into the active state is referred to also as "each drive signal is turned on" and the fact that each drive signal is turned into the non-active state is referred to also as "each drive signal is turned off". Additionally, the fact that each gate unit or each transistor becomes conductive is referred to also as "each gate unit or each transistor is turned on" and the fact that each gate unit or each transistor becomes non-conductive is referred to also as "each gate unit or each transistor is turned off".

<Operation of Unit Pixel 100>

Figure 3:
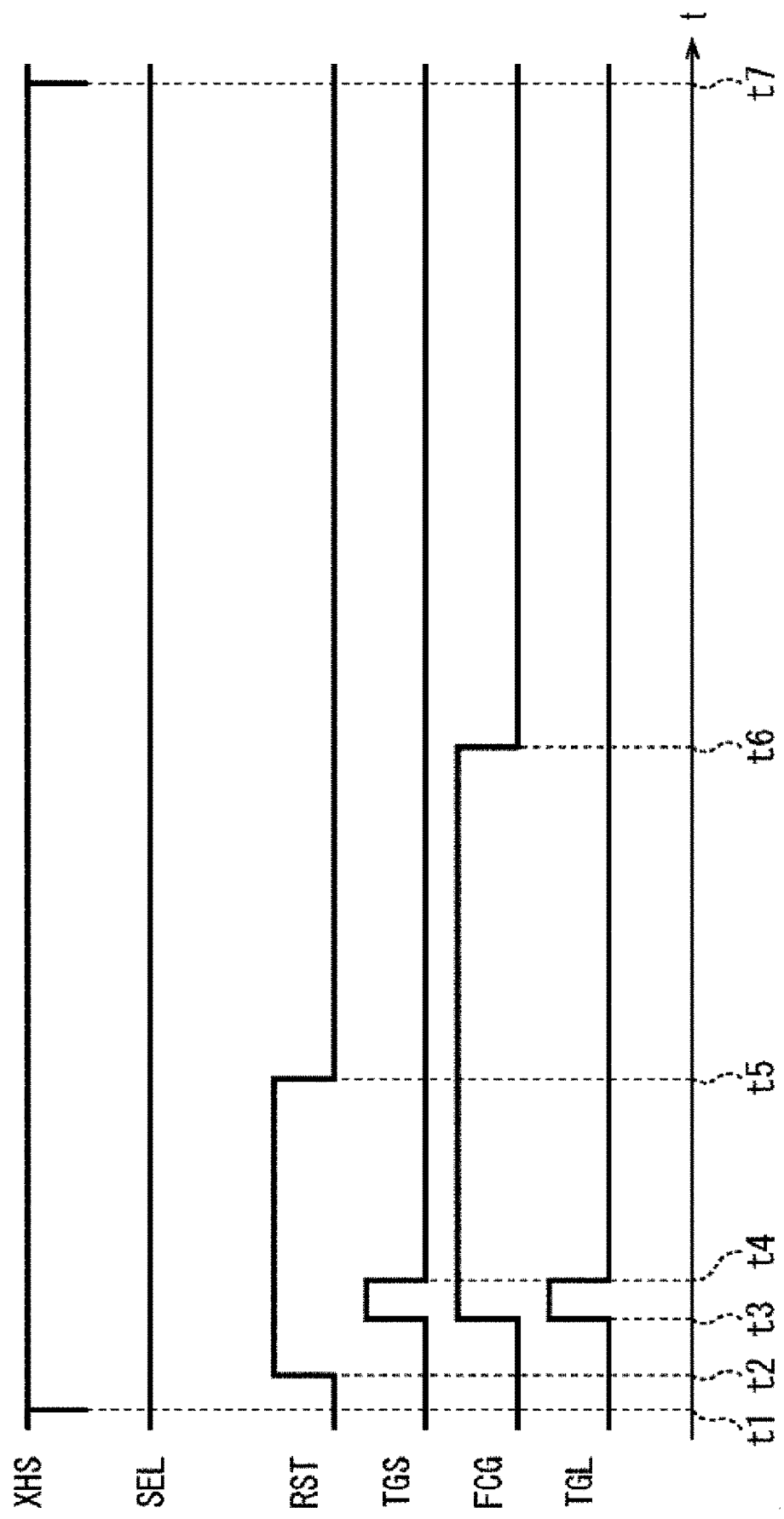
FIG. 3 is an explanatory timing diagram of the operation when the exposure of a unit pixel starts.
Figure 4:
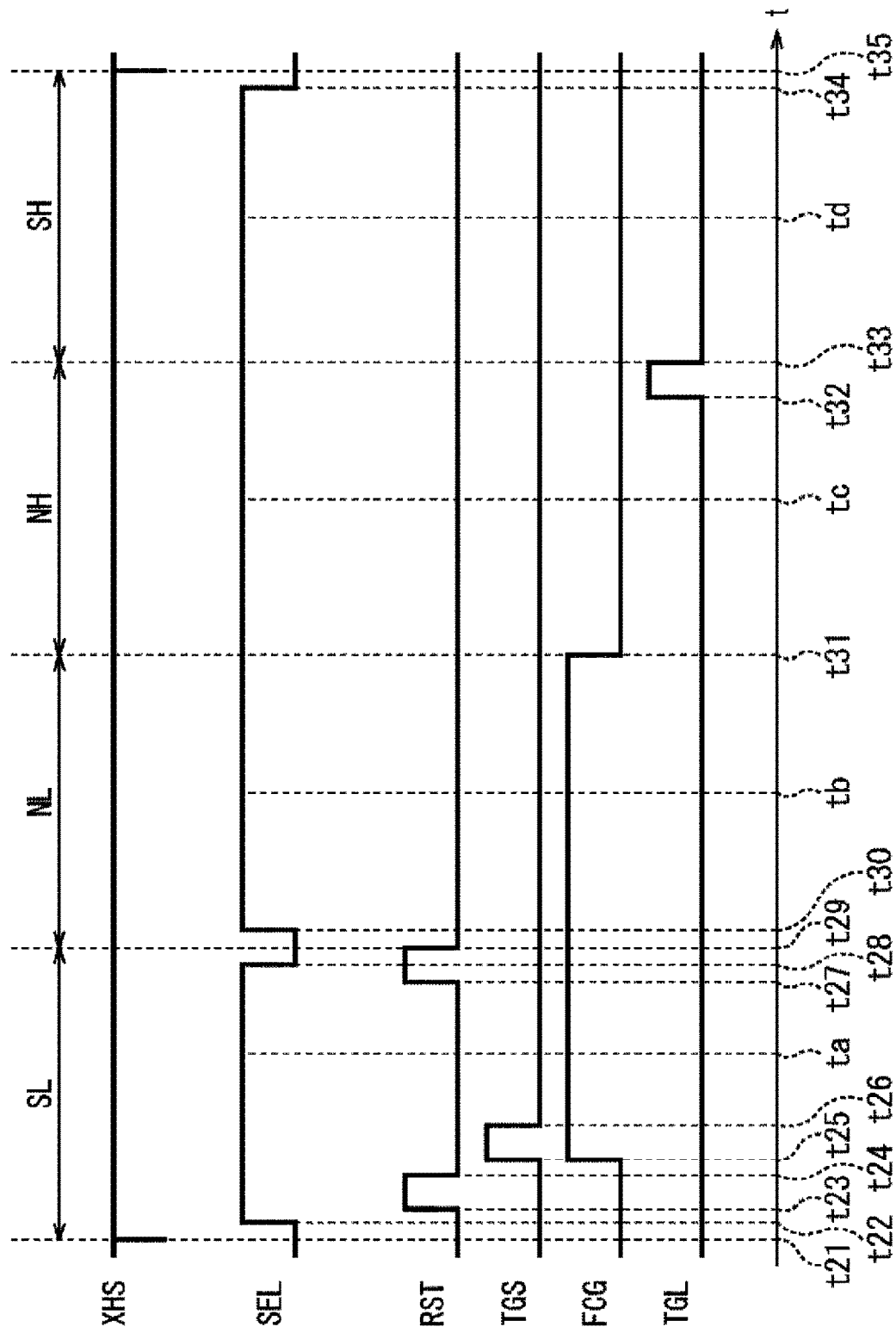
FIG. 4 is an explanatory timing diagram of the operation when the unit pixel is read.

Next, the operation of the unit pixel 100 will be described with reference to the timing diagrams of FIGS. 3 and 4. First, the operation of the unit pixel 100 at the start of exposure will be described with reference to the timing diagram of FIG. 3. This process is performed, for example, by pixel row or by a plurality of pixel rows in the pixel array unit 11 in predetermined scanning order. Note that FIG. 3 illustrates the timing diagram of the horizontal synchronization signal XHS and the drive signals SEL, RST, TGS, FCG, and TGL.

First, the horizontal synchronization signal XHS is input and the process for exposure of the unit pixel 100 is started at a time t1.

Next, the drive signal RST is turned on and the reset gate unit 107 is turned on at a time t2. This resets the potential of the FD unit 108 into the level of the power-supply voltage VDD.

Next, the drive signals TGL, FCG, and TGS are turned on and the first transfer gate unit 102, the second transfer gate unit 104, and the third transfer gate unit 105 are turned on at a time t3. This binds the potential well of the charge accumulation unit 106 with the potential well of the FD unit 108. Additionally, the charge accumulated in the first opto-electronic converter 101 is transferred via the first transfer gate unit 102 to the bound region in which the potential wells are bound. The charge accumulated in the second opto-electronic converter 103 transferred via the third transfer gate unit 105 to the bound region. Then, the bound region is reset.

Next, the drive signals TGL and TGS are turned off and the first transfer gate unit 102 and the third transfer gate unit 105 are turned off at a time t4. This starts the accumulation of the charge into the first opto-electronic converter 101 and the second opto-electronic converter 103 and an exposure period starts.

Next, the drive signal RST is turned off and the reset gate unit 107 is turned off at a time t5.

Next, the drive signal FCG is turned off and the second transfer gate unit 104 is turned off at a time t6. This causes the charge accumulation unit 106 to start accumulation of the charge overflowing from the second opto-electronic converter 103 and transferred through the overflow path of the third transfer gate unit 105.

Then, the horizontal synchronization signal XHS is input at a time t7.

(Operation of Unit Pixel 100 for Readout)

Next, the operation of the unit pixel 100 for reading a pixel signal will be described with reference to the timing diagram of FIG. 4. This process is performed, for example, by pixel row or by a plurality of pixel rows in the pixel array unit 11 in predetermined scanning order after a predetermined period of time has elapsed since the process illustrated FIG. 3 has been performed. Note that FIG. 4 illustrates the timing diagram of the horizontal synchronization signal XHS and the drive signals SEL, RST, TGS, FCG, and TGL.

First, the horizontal synchronization signal XHS is input and the period of readout of the unit pixel 100 starts at a time t21.

The selection signal SEL is turned on and the selection transistor 110 is turned on at a time t22. Thus, the unit pixel 100 is selected.

Next, the drive signal RST is turned on and the reset gate unit 107 is turned on at a time t23. Thus, the potential of the FD unit 108 is reset into the level of the power-supply voltage VDD.

Next, the drive signal RST is turned off and the reset gate unit 107 is turned off at a time t24.

Next, the drive signals FCG and TGS are turned on and the second transfer gate unit 104 and the third transfer gate unit 105 are turned on at a time t25. This binds the potential well of the charge accumulation unit 106 and the potential well of the FD unit 108 and transfers the charge accumulated in the second opto-electronic converter 103 to the bound region in which the potential wells are bound. Thus, the charge accumulated in the second opto-electronic converter 103 and the charge accumulation unit 106 during the exposure period are accumulated in the bound region.

At the time t25, the readout of the pixel signal is started and the exposure period is completed.

Next, the drive signal TGS is turned off and the third transfer gate unit 105 is turned off at a time t26. This stops the transfer of the charge from the second opto-electronic converter 103.

Next, the signal SL based on the potential in the region in which the potential well of the charge accumulation unit 106 and the potential well of the FD unit 108 are bound is output via the amplification transistor 109 and the selection transistor 110 to the vertical signal line 17 at a time to between the time t26 and the time t27. The signal SL is a signal based on the charge generated in the second opto-electronic converter 103 and accumulated in the second opto-electronic converter 103 and the charge accumulation unit 106 during the exposure period.

Additionally, the signal SL is a signal based on the potential in the bound region in which the potential well of the charge accumulation unit 106 and the potential well of the FD unit 108 are bound when the charge accumulated in the second opto-electronic converter 103 and the charge accumulation unit 106 during the exposure period is accumulated in the bound region. Thus, the amount of charge converted in charge-voltage conversion when the signal SL is read is the total amount of charge in the charge accumulation unit 106 and the charge of the FD unit 108.

Note that the signal SL is referred to also as a low-sensitivity data signal SL hereinafter.

Next, the drive signal RST is turned on and the reset gate unit 107 is turned on at a time t27. This resets the region in which the potential well of the charge accumulation unit 106 and the potential well of the FD unit 108 are bound.

Next, the selection signal SEL is turned off and the selection transistor 110 is turned off at a time t28. Thus, the unit pixel 100 is not selected.

Next, the drive signal RST is turned off and the reset gate unit 107 is turned off at a time t29.

Next, the selection signal SEL is turned on and the selection transistor 110 is turned on at a time t30. Thus, the unit pixel 100 is selected.

Next, the signal NL based on the potential in the region in which the potential well of the charge accumulation unit 106 and the potential well of the FD unit 108 are bound is output via the amplification transistor 109 and the selection transistor 110 to the vertical signal line 17 at a time tb between the time t30 and the time t31. The signal NL is a signal based on the potential in the bound region in which the potential well of the charge accumulation unit 106 and the potential well of the FD unit 108 are bound when the bound region is reset.

Note that the signal NL is referred to also as a low-sensitivity reset signal NL hereinafter.

Next, the drive signal FCG is turned off and the second transfer gate unit 104 is turned off at a time t31.

Next, the signal NH based on the potential of the FD unit 108 is output via the amplification transistor 109 and the selection transistor 110 to the vertical signal line 17 at a time tc between the time t31 and the time t32. The signal NH is a signal based on the potential of the FD unit 108 when the FD unit 108 is reset.

Note that the signal NH is referred to also as a high-sensitivity reset signal NH hereinafter.

Next, the drive signal TGL is turned on and the first transfer gate unit 102 is turned on at a time t32. Thus, the charge generated and accumulated in the first opto-electronic converter 101 during the exposure period is transferred via the first transfer gate unit 102 to the FD unit 108.

Next, the drive signal TGL is turned off and the first transfer gate unit 102 is turned off at a time t33. This stops the transfer of the charge from the first opto-electronic converter 101 to the FD unit 108.

Next, the signal SH based on the potential of the FD unit 108 is output via the amplification transistor 109 and the selection transistor 110 to the vertical signal line 17 at a time td between the time t33 and the time t34. The signal SH is a signal based on the charge generated and accumulated in the first opto-electronic converter 101 during the exposure period.

Additionally, the signal SH is based on the potential in the FD unit 108 when the charge accumulated in the first opto-electronic converter 101 during the exposure period is accumulated in the FD unit 108. Thus, the amount of the charge converted in charge-voltage conversion when the signal SH is read is the amount of charge in the FD unit 108. The amount of charge is smaller than the amount of charge when the low-sensitivity data signal SL is read at the time ta.

Note that the signal SH is referred to also as a high-sensitivity data signal SH hereinafter.

Next, the selection signal SEL is turned off and the selection transistor 110 is turned off at a time t34. Thus, the unit pixel 100 is not selected.

Next, the horizontal synchronization signal XHS is input and the readout period in which the pixel signal of the unit pixel 100 is read is completed at a time t35.

(Description of Noise Removal Process and Arithmetic Process)

The low-sensitivity data signal SL, the low-sensitivity reset signal NL, the high-sensitivity reset signal NH, and the high-sensitivity data signal SH are output from the unit pixel 100 to the vertical signal line 17 in this order. Then, in signal processing units placed downstream, for example, the column processing unit 13 and signal processing unit 18 illustrated in FIG. 1, the low-sensitivity data signal SL, the low-sensitivity reset signal NL, the high-sensitivity reset signal NH, and the high-sensitivity data signal SH are processed in predetermined noise removal process and signal process. An exemplary noise removal process performed in the column processing unit 13 placed downstream and an exemplary arithmetic process performed in the signal processing unit 18 placed downstream will be described hereinafter.

(Noise Removal Process)

First, a noise removal process that the column processing unit 13 performs will be described.

(Exemplary Noise Removal Process)

First, an exemplary noise removal process will be described.

The column processing unit 13 generates a low-sensitivity differential signal SNL by taking the difference between the low-sensitivity data signal SL and the low-sensitivity reset signal NL. Thus, the low-sensitivity differential signal SNL=the low-sensitivity data signal SL−the low-sensitivity reset signal NL holds.

Next, the column processing unit 13 generates a high-sensitivity differential signal SNH by taking the difference between the high-sensitivity data signal SH and the high-sensitivity reset signal NH. Thus, the high-sensitivity differential signal SNH=the high-sensitivity data signal SH−the high-sensitivity reset signal NH holds.

As described above, the low-sensitivity signals SL and NL are processed in a DDS process in which fixed pattern noise specific to a pixel, for example, the variations in the threshold of the amplification transistor in the pixel is removed but reset noise is not removed. The high-sensitivity signals SH and NH is processed in a CDS process in which reset noise and fixed pattern noise specific to a pixel, for example, the variations in the threshold of the amplification transistor in the pixel are removed.

(Exemplary Arithmetic Process of Pixel Signal)

An exemplary arithmetic process of a pixel signal will be described hereinafter.

When the low-sensitivity differential signal SNL is in a predetermined range, the signal processing unit 18 calculates the proportion of the low-sensitivity differential signal SNL to the high-sensitivity differential signal SNH as gain by pixel, by a plurality of pixels, by color, by specific pixel in a shared pixel unit, or evenly in all pixels, and generates a gain table. Then, the signal processing unit 18 calculates the product of the low-sensitivity differential signal SNL and the gain table as the correction value of the low-sensitivity differential signal SNL.

In this example, the gain is G and the value of the corrected low-sensitivity differential signal SNL (hereinafter, referred to as a corrected low-sensitivity differential signal) is SNL'. The gain G and the corrected low-sensitivity differential signal SNL' can be found with the following expressions (1) and (2).

$$G = SNH/SNL = (Cfd + Cfc)/Cfd \quad (1)$$

$$SNL' = G \times SNL \quad (2)$$

In this example, Cfd is the value of the capacity of the FD unit 108, and Cfc is the value of the capacity of the charge accumulation unit 106. Thus, the gain G is equivalent to the proportion of the capacity of the FD unit 108 to the capacity of the charge accumulation unit 106.

Figure 5:
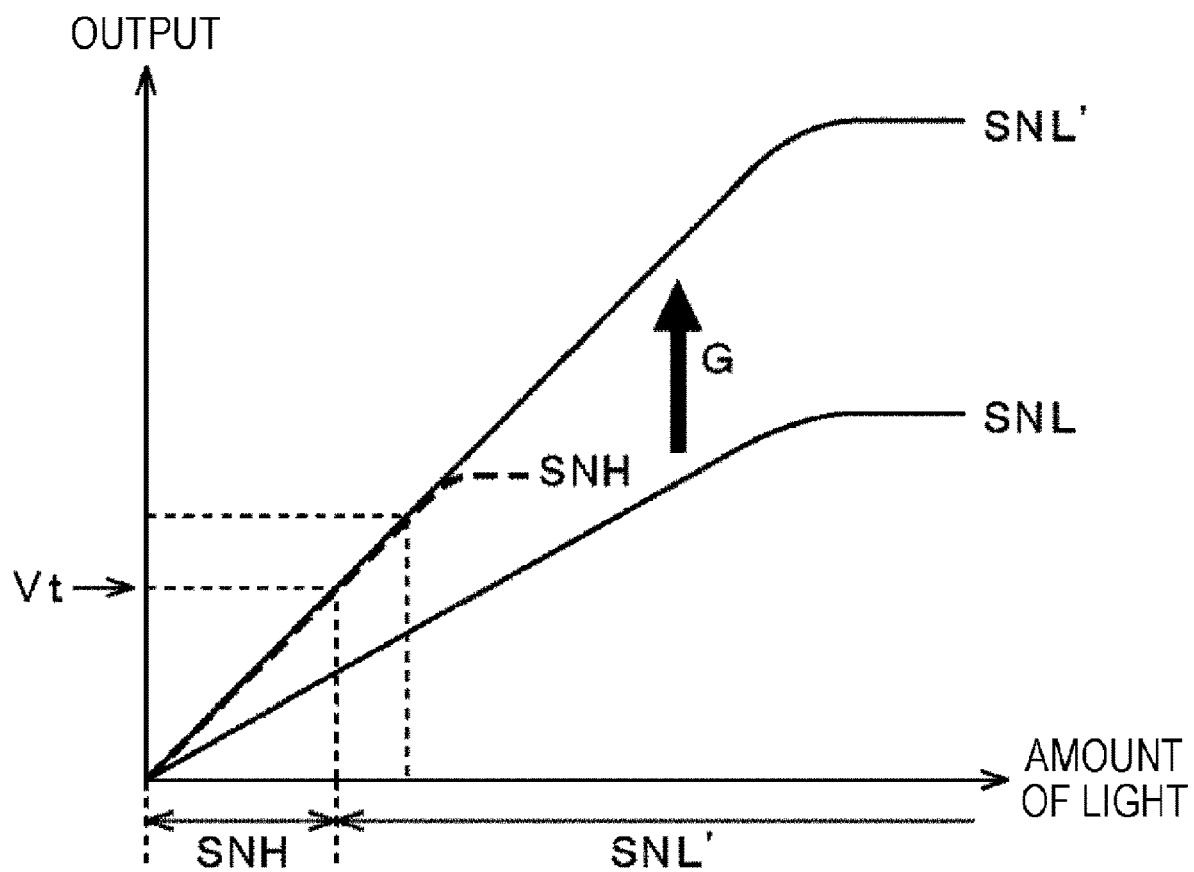
FIG. 5 is an explanatory diagram of the property of the amount of light and the output describing a signal process.

FIG. 5 illustrates the relationship between the amount of incident light and each of the low-sensitivity differential signal SNL, the high-sensitivity differential signal SNH, and the corrected low-sensitivity differential signal SNL'.

Next, the signal processing unit 18 uses a predetermined threshold Vt illustrated in FIG. 5. In terms of a photo-response characteristic, the threshold Vt is set in a region before the signal processing unit 18 is saturated with the high-sensitivity differential signal SNH and in which the photo-response characteristic is linear.

Then, when the high-sensitivity differential signal SNH does not exceed the predetermined threshold Vt, the signal processing unit 18 outputs the high-sensitivity differential signal SNH as the pixel signal SN of the pixel to be processed. In other words, when SNH<Vt holds, the pixel signal SN=the high-sensitivity differential signal SNH holds.

On the other hand, when the high-sensitivity differential signal SNH exceeds the predetermined threshold Vt, the signal processing unit 18 outputs the corrected low-sensitivity differential signal SNL' of the low-sensitivity differential signal SNL as the pixel signal SN of the pixel to be processed. In other words, when Vt≤SNH holds, the pixel signal SN=the corrected low-sensitivity differential signal SNL' holds.

By the arithmetic process described above, the signal at a low light condition can smoothly be switched to the signal at a high light condition.

Additionally, providing the charge accumulation unit 106 in the low-sensitivity second opto-electronic converter 103 in the CMOS image sensor 10 can raise the level at which the second opto-electronic converter 103 is saturated with the low-sensitivity data signal SL. Thus, while the minimum value of the dynamic range is maintained, the maximum value of the dynamic range can be increased. This can extend the dynamic range.

For example, LED flicker sometimes occurs in an in-vehicle image sensor. The LED flicker is a phenomenon in which an image of an object flickering such as an LED light source is not captured depending on the time when the object flickers. The LED flicker occurs, for example, because the dynamic range of an image sensor in the past is narrow and it is necessary to adjust the exposure period for each object.

In other words, to deal with objects in various light conditions, an image sensor in the past increases the exposure period for an object in a low light condition and decreases the exposure period for an object in a high light condition. This enables the image sensor in the past to deal with objects in various light conditions even when the dynamic range of the image sensor is narrow. On the other hand, the image sensor reads the signal at a constant rate regardless of the length of the exposure period. Thus, when the exposure period is set at a unit shorter than the period in which the signal is read, the light entering the opto-electronic converter outside the exposure period is converted into charge in opto-electronic conversion and is destroyed without readout.

On the other hand, the CMOS image sensor 10 can extend the dynamic range as described above, and can increase the exposure period. This prevents LED flicker from occurring. Additionally, using the CMOS image sensor 10 can prevent an artifact occurring when the number of divided times in a time division scheme or the number of divided spaces in a space division scheme increases, or can prevent the reduction in resolution.

<Configuration of Unit Pixel>

Next, the configuration of the unit pixel 100 including the high-sensitivity first opto-electronic converter 101 and the low-sensitivity second opto-electronic converter 103 as described above will additionally be described. Hereinafter, with reference to cross-sectional views of the unit pixel 100, the configuration of the unit pixel 100 will additionally be described.

(First Configuration of Unit Pixel)

Figure 6:
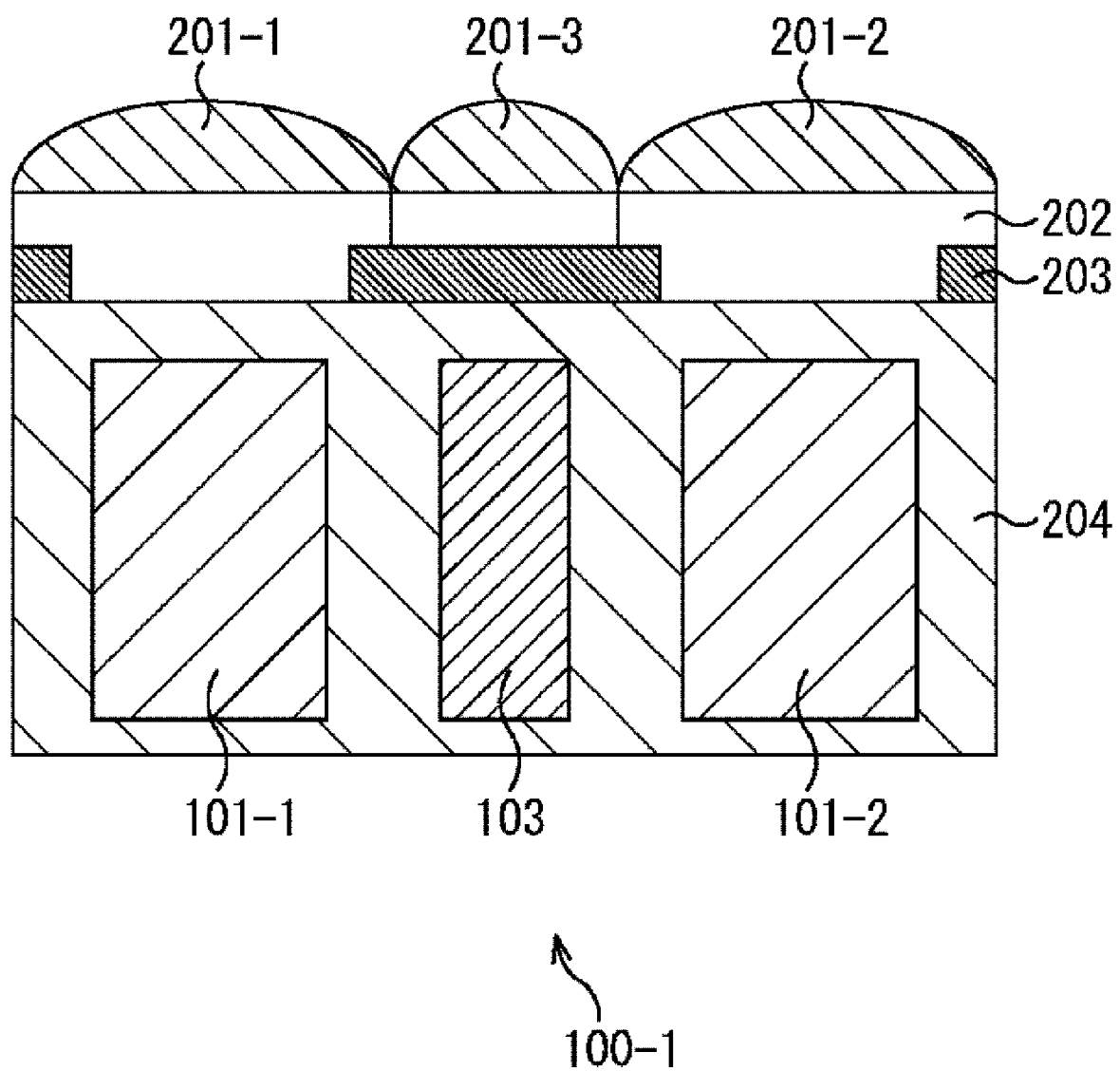
FIG. 6 is an explanatory diagram of a first configuration of a pixel.

FIG. 6 is a cross-sectional view of the unit pixel 100 when the CMOS image sensor 10 is a backside-illumination image sensor. The unit pixel 100 illustrated in FIG. 6 will be referred to as a unit pixel 100-1 hereinafter to indicate that the unit pixel 100 illustrated in FIG. 6 has a first configuration.

In the unit pixel 100-1, an on-chip lens 201, a colored filter 202, a light-blocking film 203, and a silicon substrate 204 are layered from the upper part of the drawing. The first opto-electronic converter 101 and the second opto-electronic converter 103 are formed in the silicon substrate 204.

Note that, although not illustrated, for example, a glass cover is layered on the on-chip lens 201, and a wiring layer or a supporting substrate is layered under the silicon substrate 204. The parts necessary for the description will be properly illustrated and described while the illustration and description of the other parts will properly be omitted hereinafter.

FIG. 6 illustrates the first opto-electronic converter 101-1, the first opto-electronic converter 101-2, and the second opto-electronic converter 103. Additionally, the on-chip lenses 201-1 to 201-3 are formed on the three opto-electronic converters, respectively.

The light-blocking film 203 is formed only on the second opto-electronic converter 103. The light-blocking film 203 has a function to absorb or reflect light. The light-blocking film 203 can be made of a metal film so that the light-blocking film 203 works as a film that reflects light. The light-blocking film 203 can be a film that absorbs a part of light and allows a part of the light to pass through the film. Alternatively, the light-blocking film 203 can be an optical absorption film that absorbs light.

The light-blocking film 203 is, for example, an amorphous silicon film, a polysilicon film, a germanium (Ge) film, a gallium nitride (GaN) film, a cadmium telluride (CdTe) film, a gallium arsenide (GaAs) film, an indium phosphide (InP) film, a CuInSe2 film, a Cu2S film, a CIGS film, a non-conductive carbon film, a black resist film, or an organic opto-electronic conversion film.

Note that the light-blocking film is formed on the second opto-electronic converter 103 and the light-blocking film can be made of the materials described above also in second to sixteenth configurations described below. Note that the materials of which the light-blocking film is made are examples. The material of which the light-blocking film is made is not limited to the example materials.

Forming the light-blocking film 203 on the low-sensitivity second opto-electronic converter 103 as described above causes the light-blocking film 203 to absorb the light passing through the on-chip lens 201-3 and reduces the light entering the second opto-electronic converter 103. This further reduces the sensitivity of the second opto-electronic converter 103. This increases the performance of the second opto-electronic converter 103 as the low-sensitivity opto-electronic converter. Thus, the dynamic range can be extended.

(Second Configuration of Unit Pixel)

Figure 7:
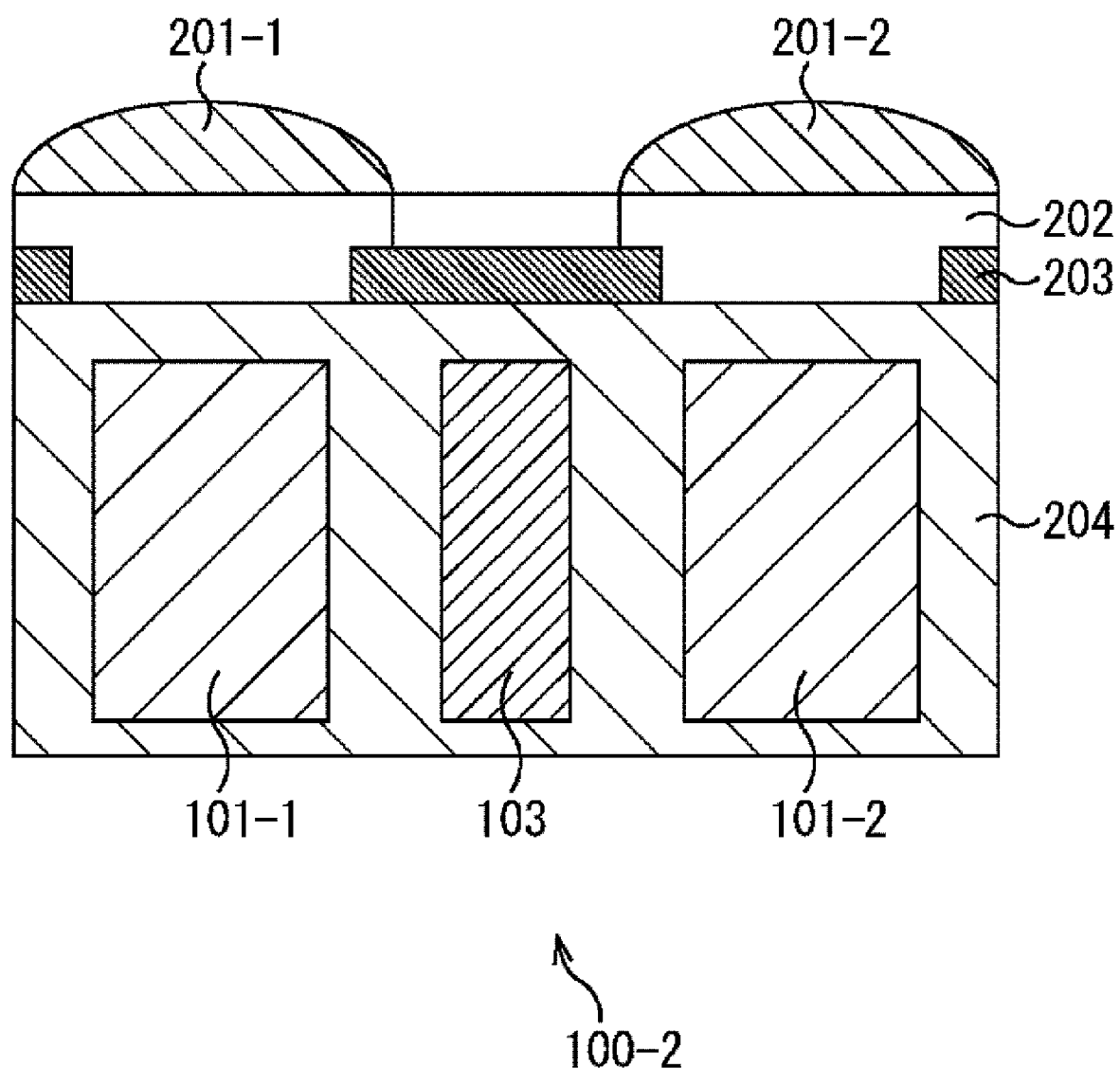
FIG. 7 is an explanatory diagram of a second configuration of a pixel.

Next, the second configuration of the unit pixel 100 will be described. FIG. 7 is a cross-sectional view of a unit pixel 100-2 when the CMOS image sensor 10 is a backside-illumination image sensor, similarly to the unit pixel 100-1 illustrated in FIG. 6.

In comparison between the unit pixel 100-2 illustrated in FIG. 7 and the unit pixel 100-1 illustrated in FIG. 6, the unit pixel 100-2 has a configuration in which the on-chip lens 201-3 formed on the second opto-electronic converter 103 in the unit pixel 100-1 is removed, differently from the unit pixel 100-1, and the other parts in the unit pixel 100-2 are the same as the parts in the unit pixel 100-1. Hereinafter, the description of the parts similar to the parts of the unit pixel 100-1 will be put with similar reference signs and the descriptions will properly be omitted. Similarly, the descriptions of the other parts will properly be omitted when the other parts are similar to the parts of the unit pixel 100-1.

The unit pixel 100-2 has a configuration in which the on-chip lens 201-3 is not formed on the second opto-electronic converter 103. Thus, the light is not collected on the second opto-electronic converter 103 and enters the second opto-electronic converter 103 and the light entering the second opto-electronic converter 103 is reduced. This further reduces the sensitivity of the second opto-electronic converter 103 and can extend the dynamic range of the low-sensitivity opto-electronic converter.

(Third Configuration of Unit Pixel)

Figure 8:
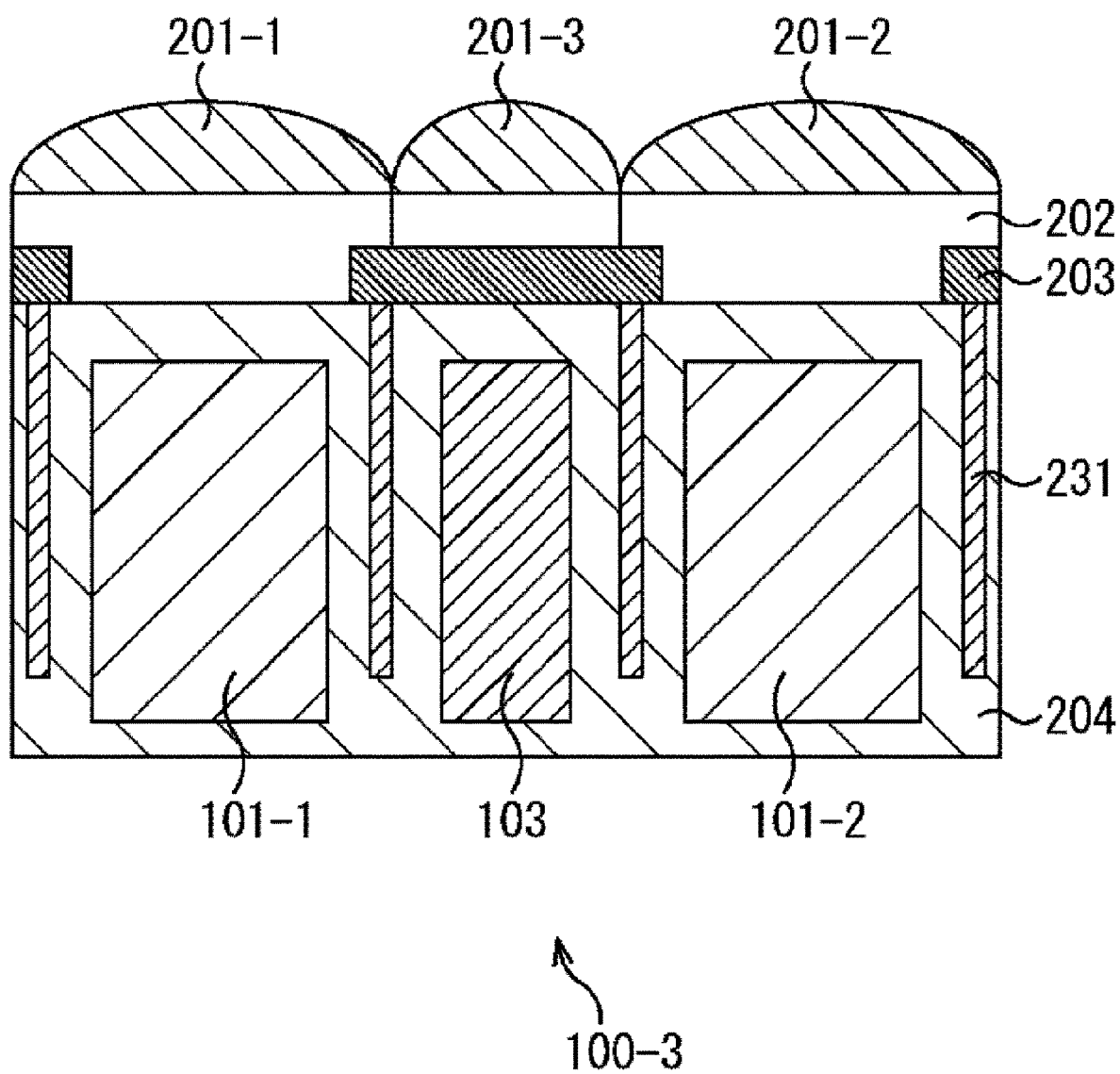
FIG. 8 is an explanatory diagram of a third configuration of a pixel.

Next, the third configuration of the unit pixel 100 will be described. FIG. 8 is a cross-sectional view of a unit pixel 100-3 when the CMOS image sensor 10 is a backside-illumination image sensor, similarly to the unit pixel 100-1 illustrated in FIG. 6.

In comparison between the unit pixel 100-3 illustrated in FIG. 8 and the unit pixel 100-1 illustrated in FIG. 6, the unit pixel 100-3 has a configuration in which a light-blocking wall 231 is added to the configuration of the unit pixel 100-1, differently from the unit pixel 100-1, and the other parts of the unit pixel 100-3 are the same as the parts of the unit pixel 100-1.

The light-blocking wall 231 is provided between pixels. In the unit pixel 100-3 illustrated in FIG. 8, the light-blocking walls 231 are provided between the first opto-electronic converter 101-1 and the second opto-electronic converter 103, and between the first opto-electronic converter 101-2 and the second opto-electronic converter 103. As describe above, the light-blocking wall 231 is provided in a pixel separation region in which the pixels are separate from each other. The light-blocking wall 231 can be formed in a trench or groove and can include one or more insulating films extending from the light receiving surface.

The light-blocking walls 231 can be formed in trenches from a combination of a negative fixed charge film and an oxide film. The combination can be a combination of a negative fixed charge film, an oxide film, and a metal. Examples of a negative fixed charge film include hafnium oxide and tantalum oxide.

The light-blocking wall 231 is used to prevent light leaking from an opto-electronic converter into the opto-electronic converters next to the opto-electronic converter. Providing the light-blocking wall 231 can reduce, for example, the occurrence of mixture of colors. In addition, the light-blocking wall 231 can prevent light from leaking into a low sensitivity pixel 103 from other pixels, and can therefore help to maintain the accuracy of the unit pixel output.

Also in this configuration, forming a light-blocking film 203 on the low-sensitivity second opto-electronic converter 103 causes the light-blocking film 203 to absorb the light passing through the on-chip lens 201-3 and reduces the light entering the second opto-electronic converter 103. This further reduces the sensitivity of the second opto-electronic converter 103. Thus, the dynamic range can be extended.

Providing the light-blocking wall 231 can reduce, for example, the occurrence of mixture of colors.

(Fourth Configuration of Unit Pixel)

Figure 9:
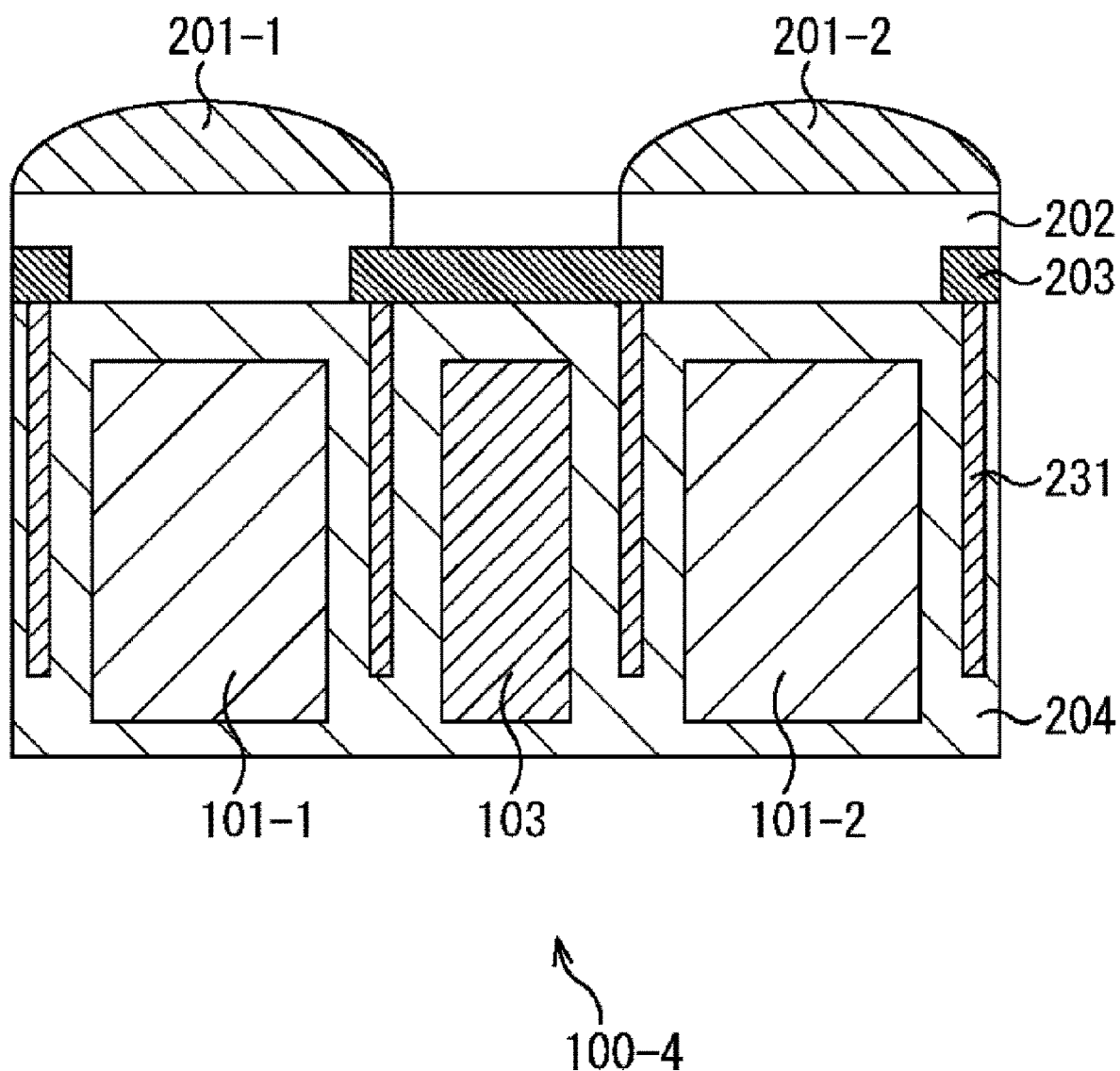
FIG. 9 is an explanatory diagram of a fourth configuration of a pixel.

Next, the fourth configuration of the unit pixel 100 will be described. FIG. 9 is a cross-sectional view of a unit pixel 100-4 when the CMOS image sensor 10 is a backside-illumination image sensor, similarly to the unit pixel 100-2 illustrated in FIG. 7.

In comparison between the unit pixel 100-4 illustrated in FIG. 9 and the unit pixel 100-2 illustrated in FIG. 7, the unit pixel 100-4 has a configuration in which a light-blocking wall 231 is added to the configuration of the unit pixel 100-2, differently from the unit pixel 100-2, and the other parts, for example, the second opto-electronic converter 103 without the on-chip lens 201-3 in the unit pixel 100-4 are the same as the parts of the unit pixel 100-2. Additionally, the configuration to which the light-blocking wall 231 is added is the same as the configuration of the unit pixel 100-3 illustrated in FIG. 8.

Also in this configuration, forming a light-blocking film 203 on the low-sensitivity second opto-electronic converter 103 causes the light-blocking film 203 to absorb the light entering the light-blocking film 203 and reduces the light entering the second opto-electronic converter 103. Additionally, an on-chip lens is not formed. This further reduces the amount of light entering the second opto-electronic converter 103. This further reduces the sensitivity of the second opto-electronic converter 103. Thus, the dynamic range of the low-sensitivity opto-electronic converter can be extended. Providing the light-blocking wall 231 can reduce, for example, the occurrence of mixture of colors.

(Fifth Configuration of Unit Pixel)

Figure 10:
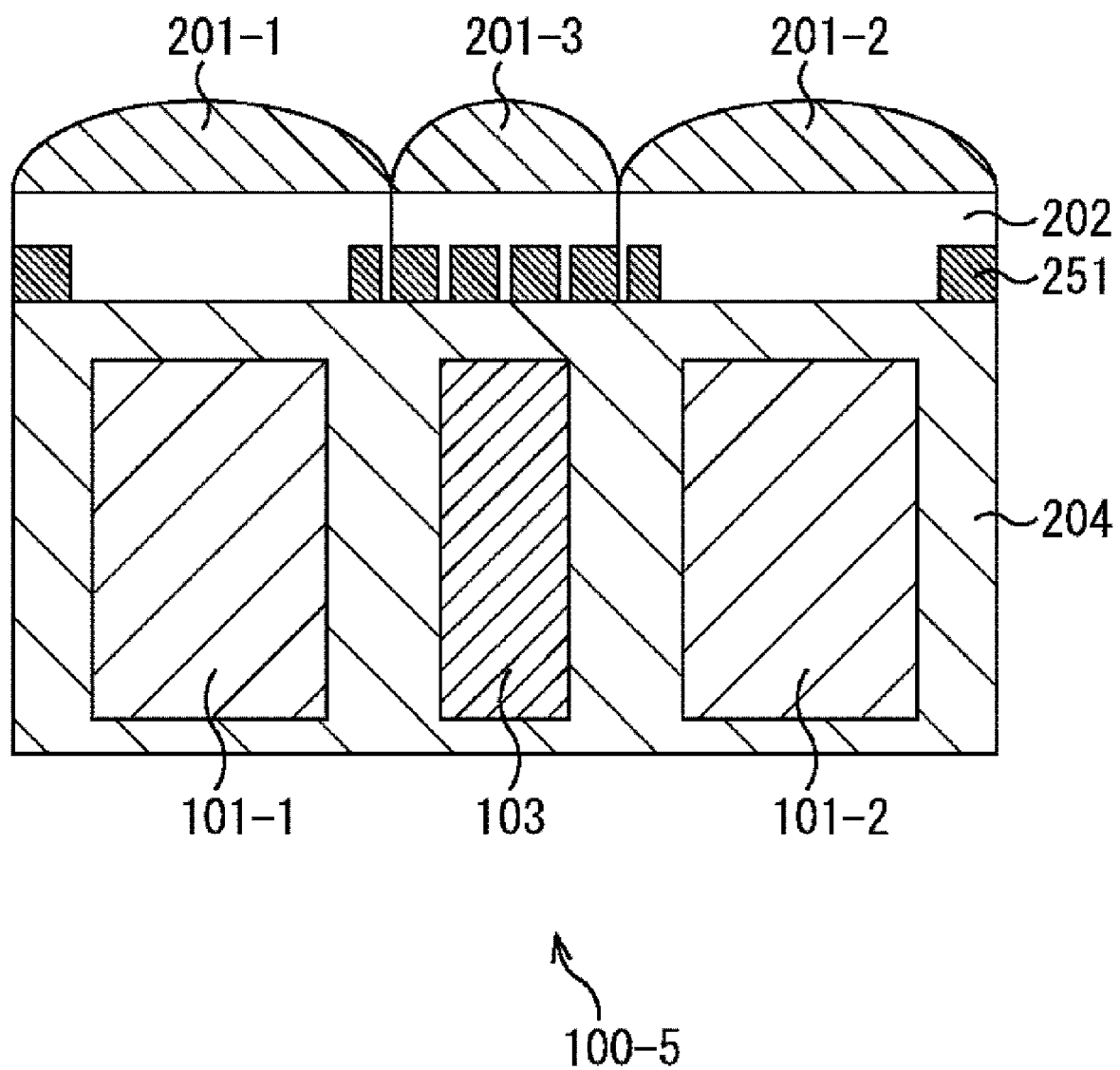
FIG. 10 is an explanatory diagram of a fifth configuration of a pixel.

Next, the fifth configuration of the unit pixel 100 will be described. FIG. 10 is a cross-sectional view of a unit pixel 100-5 when the CMOS image sensor 10 is a backside-illumination image sensor, similarly to the unit pixel 100-1 illustrated in FIG. 6.

In comparison between the unit pixel 100-5 illustrated in FIG. 10 and the unit pixel 100-1 illustrated in FIG. 6, the unit pixel 100-5 has a configuration in which a light-blocking film 251 of the unit pixel 100-5 has a different shape from the light-blocking film 203 of the unit pixel 100-1, differently from the unit pixel 100-1, and the other parts are the same as the parts of the unit pixel 100-1. The light-blocking film 251 of the unit pixel 100-5 has a slit. The light-blocking film 251 is not necessarily formed on the slit of the light-blocking film 251. Alternatively, the light-blocking film 251 at the slit can be thinner than light-blocking film 251 at parts other than the slit.

Forming a slit on the light-blocking film 251 can cause the second opto-electronic converter 103 to work as a polarization pixel.

For example, when the second opto-electronic converter 103 is installed on a vehicle and captures an image including the surface of a road, the light reflected on the surface of the road is a polarized light in parallel to the surface of the road. To capture an image from which such a polarized light is removed, a slit is formed on the light-blocking film 251 in a direction parallel to the surface of the road. This can selectively block the light reflected on the surface of the road and can receive the light from the other objects.

Forming a slit on the light-blocking film 251 as described above can reduce the light entering the second opto-electronic converter 103 and also can remove unnecessary light.

When the light-blocking film 251 is used also as a polarizer as described above, the light-blocking film 251 can be made of metal in addition to the materials described above. Note that using the light-blocking film as the polarizer can effectively reduce the direct or indirect light in comparison with using a polarizer made of metal.

Also in this configuration, forming the light-blocking film 251 on the low-sensitivity second opto-electronic converter 103 reduces the amount of light entering the second opto-electronic converter 103. Thus, lowering the sensitivity can extend the dynamic range. Additionally, forming a slit on the light-blocking film 251 can cause the light-blocking film 251 to work as a polarizer so as to remove the effect of unnecessary light such as the reflected light.

(Sixth Configuration of Unit Pixel)

Figure 11:
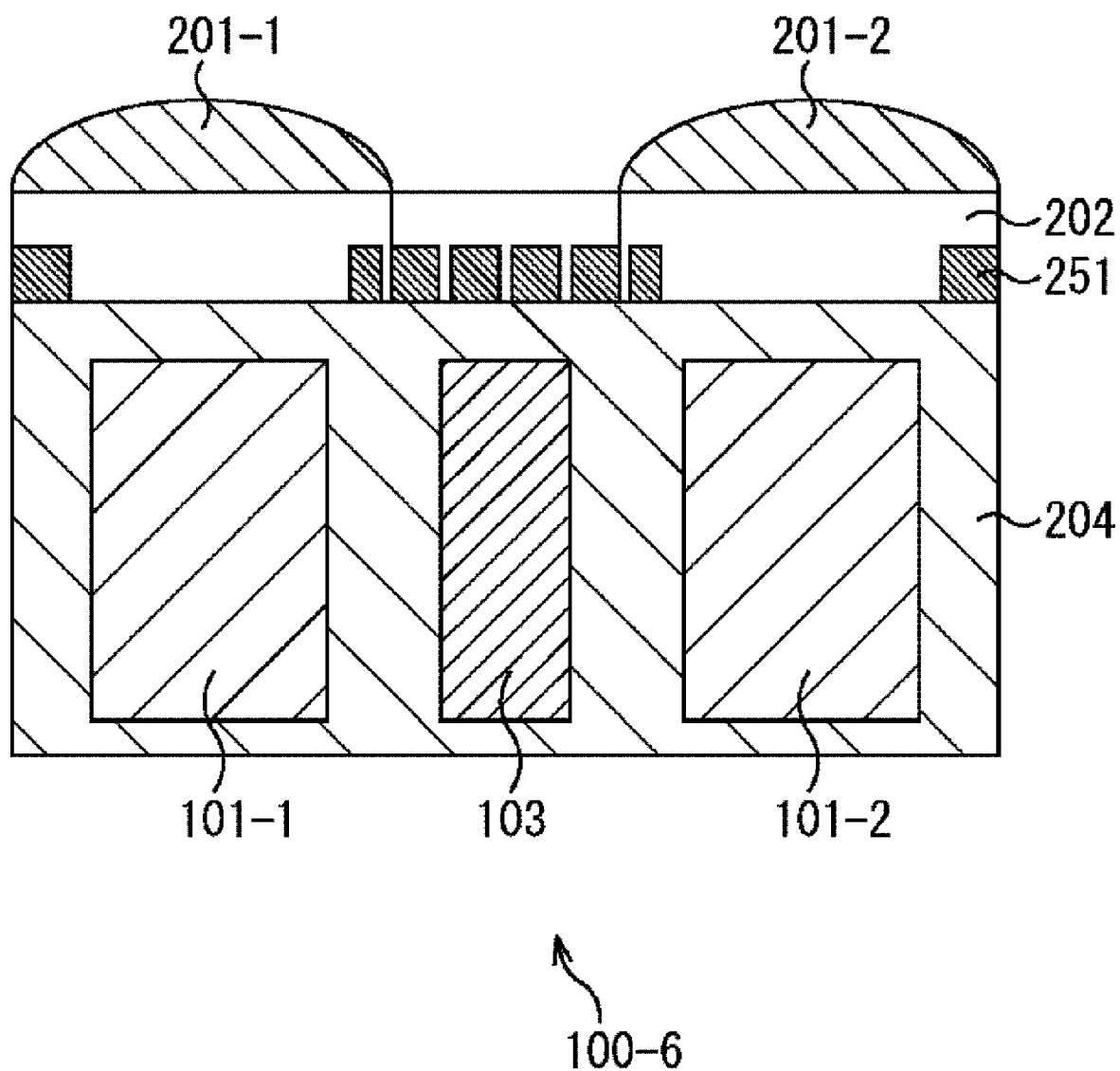
FIG. 11 is an explanatory diagram of a sixth configuration of a pixel.

Next, the sixth configuration of the unit pixel 100 will be described. FIG. 11 is a cross-sectional view of a unit pixel 100-6 when the CMOS image sensor 10 is a backside-illumination image sensor, similarly to the unit pixel 100-2 illustrated in FIG. 7.

In comparison between the unit pixel 100-6 illustrated in FIG. 11 and the unit pixel 100-2 illustrated in FIG. 7, the unit pixel 100-6 has a configuration in which the light-blocking film 251 of the unit pixel 100-6 has a different shape from the light-blocking film 203 of the unit pixel 100-2, differently from the unit pixel 100-2, and the other parts, for example, the second opto-electronic converter 103 without the on-chip lens 201-3 in the unit pixel 100-6 are the same as the parts of the unit pixel 100-2. The light-blocking film 251 of the unit pixel 100-6 has a slit, similarly to the unit pixel 100-5 illustrated in FIG. 10.

Forming a slit on the light-blocking film 251 can reduce the light entering the second opto-electronic converter 103 and also can remove unnecessary light, similarly to the unit pixel 100-5 (FIG. 10).

Also in this configuration, forming the light-blocking film 251 on the low-sensitivity second opto-electronic converter 103 reduces the amount of light entering the second opto-electronic converter 103. Thus, lowering the sensitivity can extend the dynamic range. Additionally, an on-chip lens is not formed on the second opto-electronic converter 103. This further reduces the amount of light entering the second opto-electronic converter 103. Thus, lowering the sensitivity can extend the dynamic range. Additionally, forming a slit on the light-blocking film 251 can cause the light-blocking film 251 to work as a polarizer so as to remove the effect of unnecessary light such as the reflected light.

(Seventh Configuration of Unit Pixel)

Figure 12:
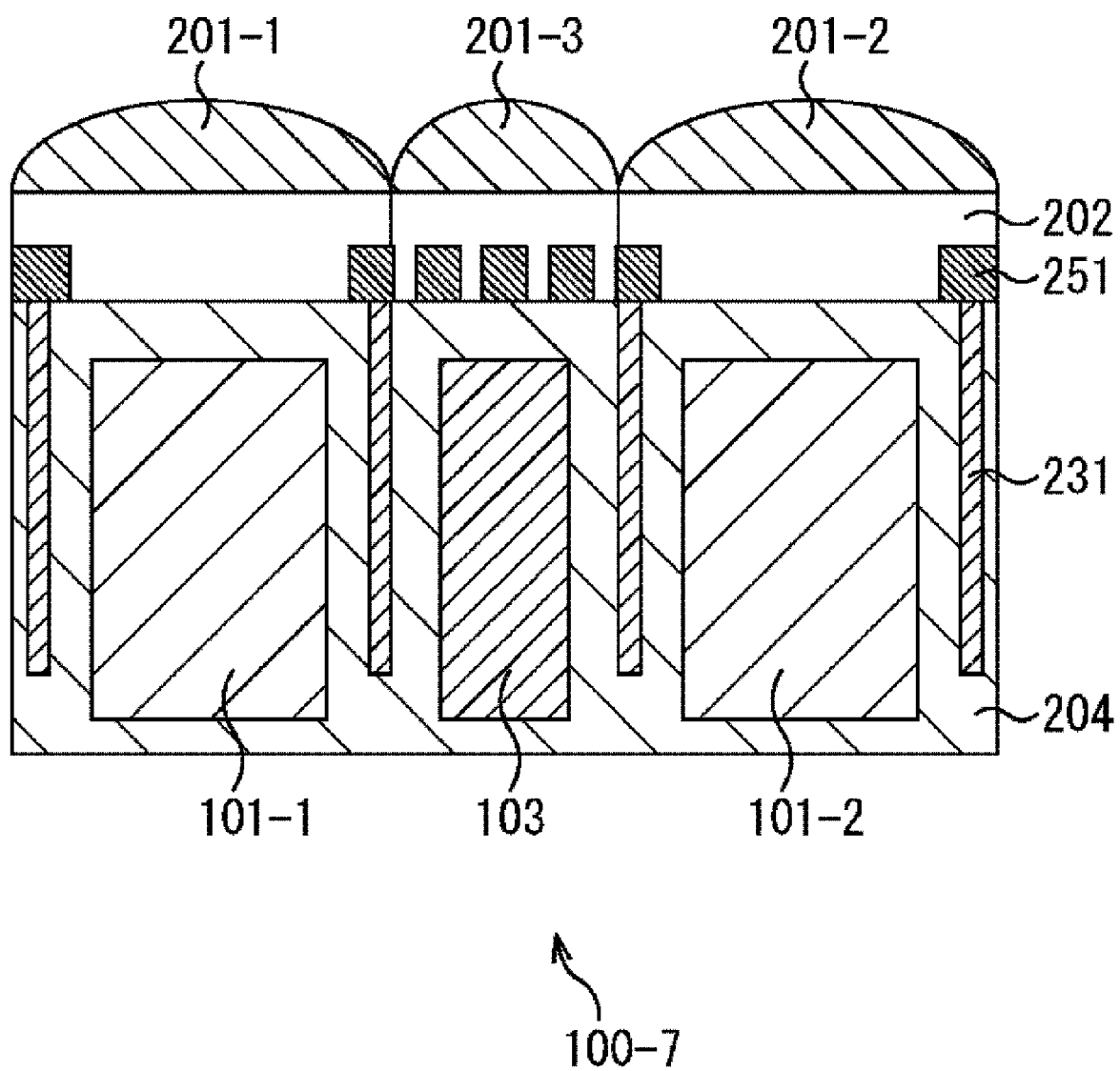
FIG. 12 is an explanatory diagram of a seventh configuration of a pixel.

Next, the seventh configuration of the unit pixel 100 will be described. FIG. 12 is a cross-sectional view of a unit pixel 100-7 when the CMOS image sensor 10 is a backside-illumination image sensor, similarly to the unit pixel 100-3 illustrated in FIG. 8.

In comparison between the unit pixel 100-7 illustrated in FIG. 12 and the unit pixel 100-3 illustrated in FIG. 8, the unit pixel 100-7 has a configuration in which the light-blocking film 251 has a slit, differently from the unit pixel 100-3, and the other parts, for example, the light-blocking film 231 provided between pixels in the unit pixel 100-7 are the same as the parts of the unit pixel 100-3.

Also in this configuration, forming the light-blocking film 251 on the low-sensitivity second opto-electronic converter 103 reduces the light entering the second opto-electronic converter 103. Thus, lowering the sensitivity can extend the dynamic range. Additionally, forming a slit on the light-blocking film 251 can cause the light-blocking film 251 to work as a polarizer so as to remove the effect of unnecessary light such as the reflected light. Providing the light-blocking wall 231 can reduce, for example, the occurrence of mixture of colors.

(Eighth Configuration of Unit Pixel)

Figure 13:
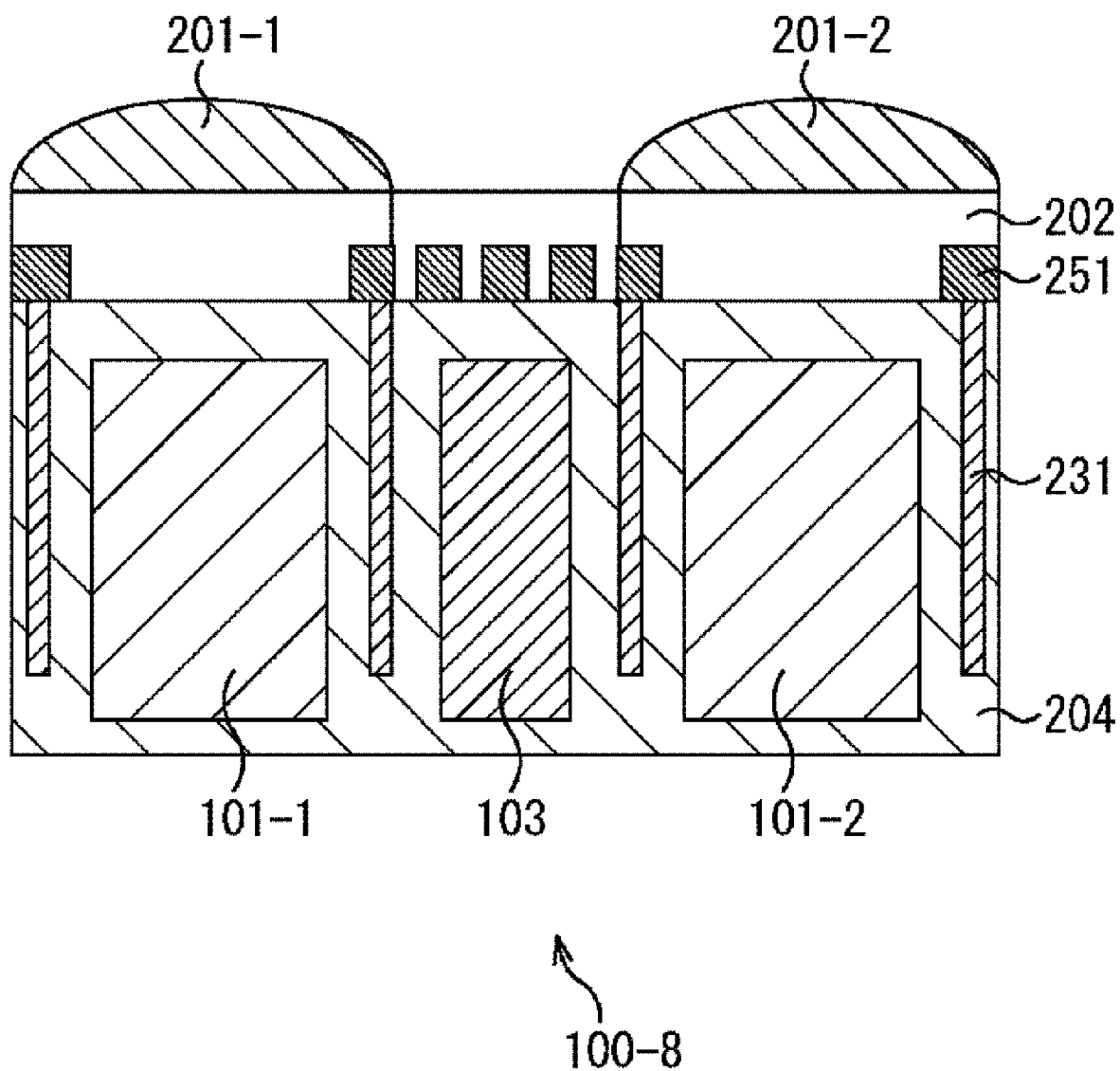
FIG. 13 is an explanatory diagram of an eighth configuration of a pixel.

Next, the eighth configuration of the unit pixel 100 will be described. FIG. 13 is a cross-sectional view of a unit pixel 100-8 when the CMOS image sensor 10 is a backside-illumination image sensor, similarly to the unit pixel 100-4 illustrated in FIG. 9.

In comparison between the unit pixel 100-8 illustrated in FIG. 13 and the unit pixel 100-4 illustrated in FIG. 9, the unit pixel 100-8 has a configuration in which the light-blocking film 251 has a slit, differently from the unit pixel 100-4, and the other parts, for example, the light-blocking film 231 provided between pixels in the unit pixel 100-8 and the second opto-electronic converter 103 without an on-chip lens are the same as the parts of the unit pixel 100-4.

Also in this configuration, forming the light-blocking film 251 on the low-sensitivity second opto-electronic converter 103 reduces the light entering the second opto-electronic converter 103. Thus, lowering the sensitivity can extend the dynamic range. Additionally, an on-chip lens is not formed on the second opto-electronic converter 103. This further reduces the light entering the second opto-electronic converter 103. Thus, lowering the sensitivity can extend the dynamic range.

Additionally, forming a slit on the light-blocking film 251 can cause the light-blocking film 251 to work as a polarizer so as to remove the effect of unnecessary light such as the reflected light. Providing the light-blocking wall 231 can reduce, for example, the occurrence of mixture of colors.

(Ninth Configuration of Unit Pixel)

Figure 14:
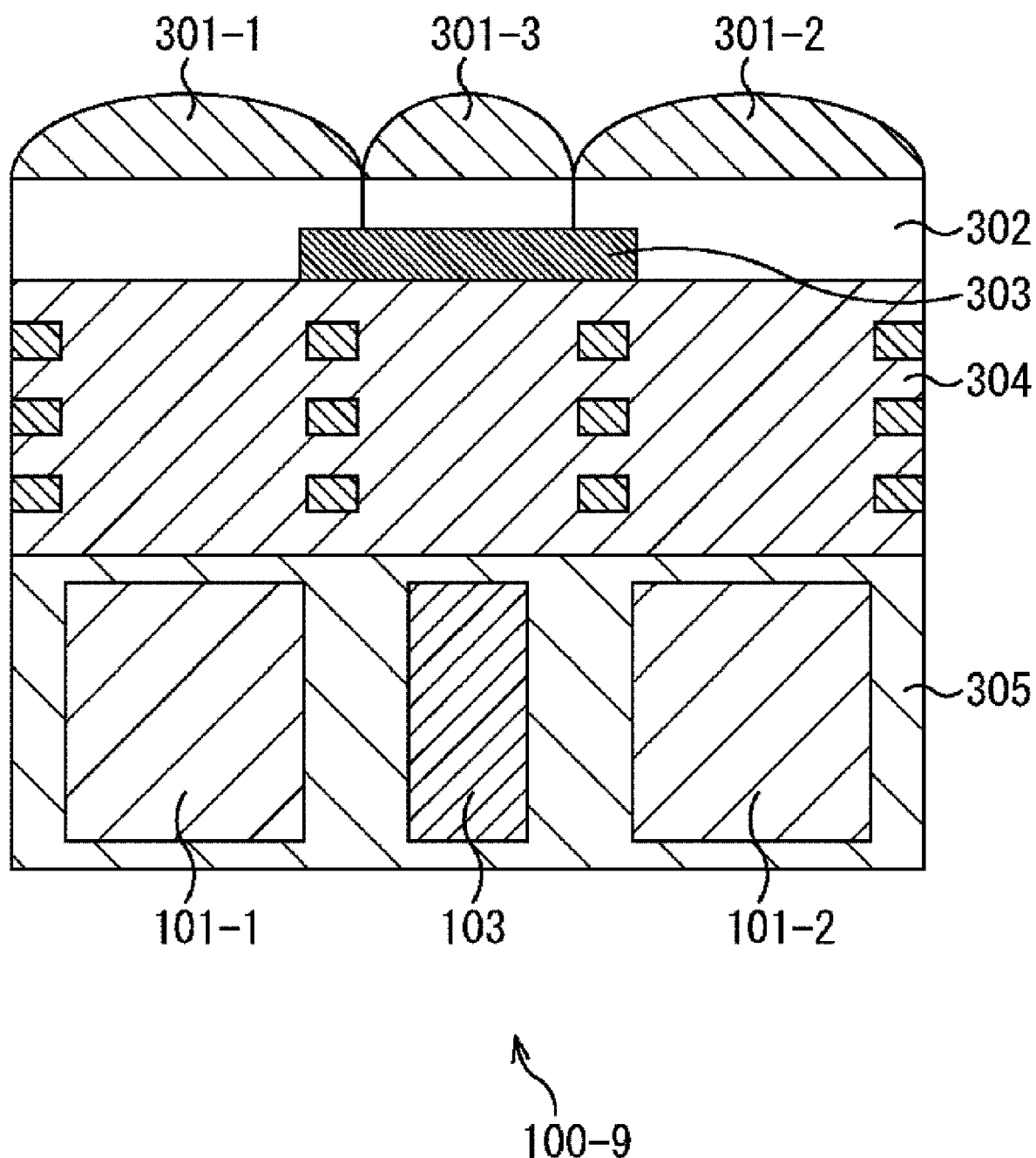
FIG. 14 is an explanatory diagram of a ninth configuration of a pixel.

FIG. 14 is a cross-sectional view of a unit pixel 100-9 when the CMOS image sensor 10 is a front-side-illumination image sensor.

In the unit pixel 100-9 illustrated in FIG. 14, an on-chip lens 301, a colored filter 302, a light-blocking film 303, a wiring layer 304, and a silicon substrate 305 are layered from the upper part of the drawing. A first opto-electronic converter 101 and a second opto-electronic converter 103 are formed in the silicon substrate 305.

Note that, although not illustrated in the drawing, for example, a glass cover is layered on the on-chip lens 201. The parts necessary for the description will properly be illustrated and additionally described while the illustration and description of the other parts will properly be omitted.

FIG. 14 illustrates the first opto-electronic converter 101-1, the first opto-electronic converter 101-2, and the second opto-electronic converter 103. Additionally, on-chip lenses 301-1 to 301-3 are formed on the three opto-electronic converters, respectively.

The light-blocking film 303 is formed only on the second opto-electronic converter 103. The light-blocking film 303 is, for example, an amorphous silicon film, a polysilicon film, a Ge film, a GaN film, a CdTe film, a GaAs film, an InP film, a CuInSe2 film, Cu2S, a CIGS film, a non-conductive carbon film, a black resist film, or an organic opto-electronic conversion film. Additionally, when the light-blocking film 303 has a slit as described below, the light-blocking film 303 can be made of metal. Note that the materials of which the light-blocking film is made are examples and the material of which the light-blocking film is made is not limited to the example materials.

Also in the front-side illumination image sensor as described above, forming the light-blocking film 303 on the low-sensitivity second opto-electronic converter 103 causes the light-blocking film 303 to absorb the light passing through the on-chip lens 301-3 and reduces the light entering the second opto-electronic converter 103. This further reduces the sensitivity of the second opto-electronic converter 103. Thus, the dynamic range can be extended.

(Tenth Configuration of Unit Pixel)

Figure 15:
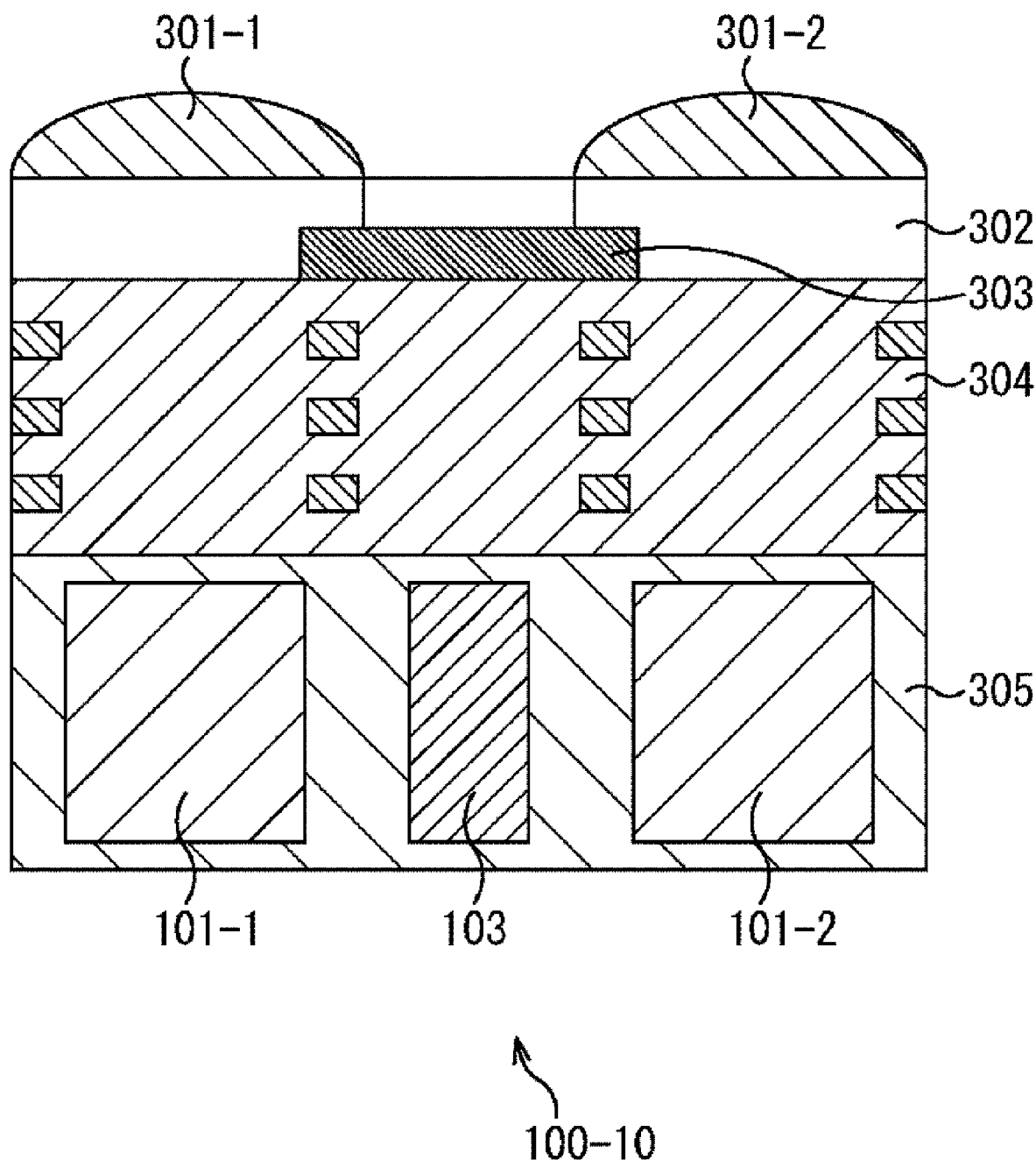
FIG. 15 is an explanatory diagram of a tenth configuration of a pixel.

Next, the tenth configuration of the unit pixel 100 will be described. FIG. 15 is a cross-sectional view of a unit pixel 100-10 when the CMOS image sensor 10 is a frontside-illumination image sensor, similarly to the unit pixel 100-9 illustrated in FIG. 14.

In comparison between the unit pixel 100-10 illustrated in FIG. 15 and the unit pixel 100-9 illustrated in FIG. 14, the unit pixel 100-10 has a configuration in which the on-chip lens 301-3 formed on the second opto-electronic converter 103 in the unit pixel 100-9 is removed, differently from the unit pixel 100-9, and the other parts in the unit pixel 100-10 are the same as the parts in the unit pixel 100-9.

The on-chip lens 301-3 is not formed on the second opto-electronic converter 103. This causes the light to enter the second opto-electronic converter 103 without being collected. This reduces the light entering the second opto-electronic converter 103. Thus, lowering the sensitivity of the second opto-electronic converter 103 can extend the dynamic range.

(Eleventh Configuration of Unit Pixel)

Figure 16:
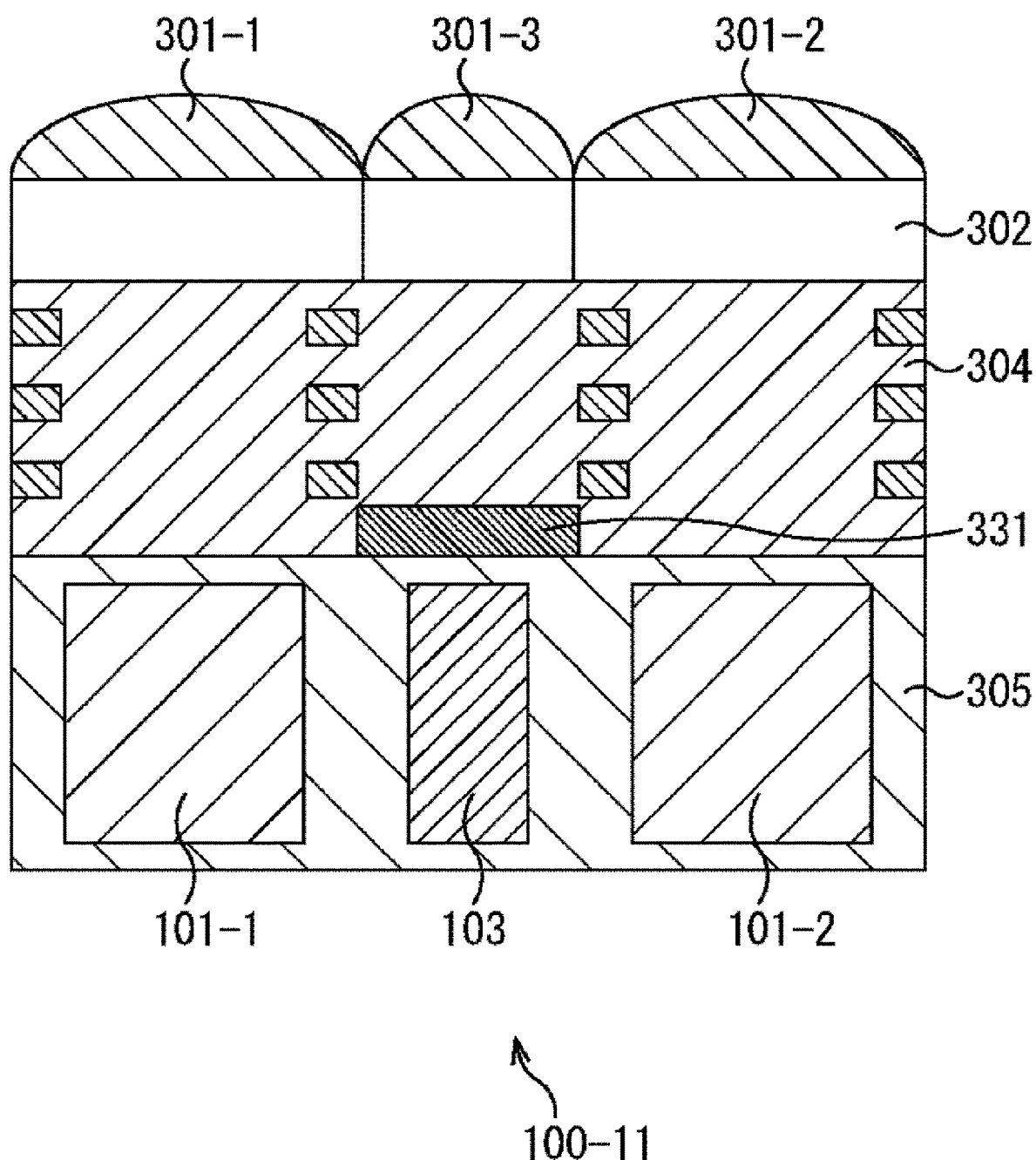
FIG. 16 is an explanatory diagram of an eleventh configuration of a pixel.

Next, the eleventh configuration of the unit pixel 100 will be described. FIG. 16 is a cross-sectional view of a unit pixel 100-11 when the CMOS image sensor 10 is a frontside-illumination image sensor, similarly to the unit pixel 100-9 illustrated in FIG. 14.

In comparison between the unit pixel 100-11 illustrated in FIG. 16 and the unit pixel 100-9 illustrated in FIG. 14, the light-blocking film 303 is formed on the upper side of the wiring layer 304 (the side facing the on-chip 301) in the drawing in the unit pixel 100-9 while the light-blocking film is formed on the lower side of the wiring layer 304 (the side facing the silicon substrate 305) in the drawing in the unit pixel 100-11. The other parts in the unit pixel 100-11 are the same as the parts in the unit pixel 100-9.

With reference to FIG. 14 again, the light-blocking film 303 of the unit pixel 100-9 is formed on the upper side of the wiring layer 304 and in the colored filter 302. On the other hand, the light-blocking film 331 of the unit pixel 100-11 illustrated in FIG. 15 is formed on the lower side of the wiring layer 304 and in the wiring layer 304 on the silicon substrate 305. As described above, the light-blocking film can be formed on the upper or lower side of the wiring layer 304.

As described above, also in a front-side illumination image sensor, the light-blocking film 303 is formed on the low-sensitivity second opto-electronic converter 103. This causes the light-blocking film 303 to absorb the light passing through the on-chip lens 301-3 and reduces the light entering the second opto-electronic converter 103. This further reduces the sensitivity of the second opto-electronic converter 103. Thus, the dynamic range can be extended.

(Twelfth Configuration of Unit Pixel)

Figure 17:
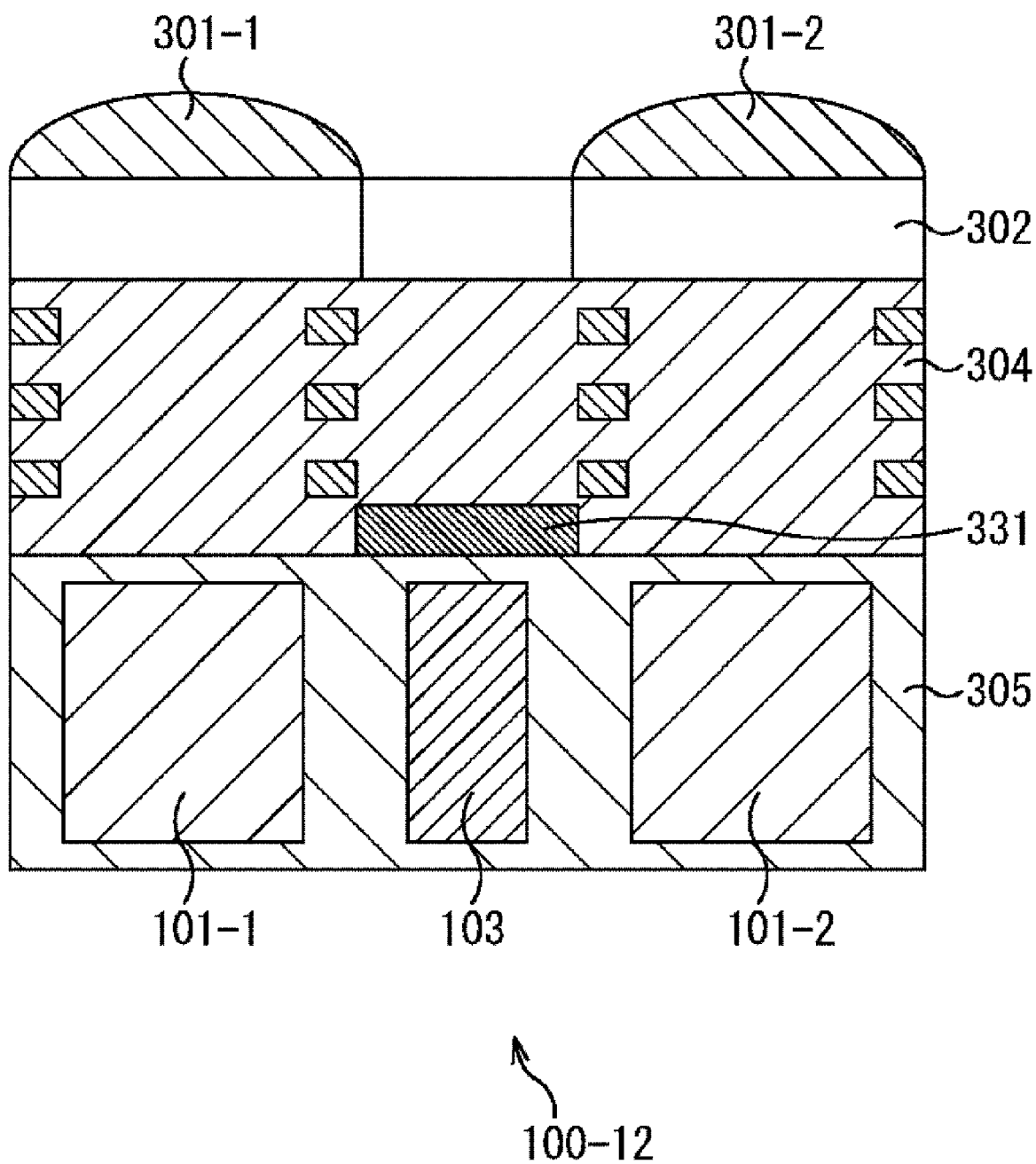
FIG. 17 is an explanatory diagram of a twelfth configuration of a pixel.

Next, the twelfth configuration of the unit pixel 100 will be described. FIG. 17 is a cross-sectional view of a unit pixel 100-12 when the CMOS image sensor 10 is a frontside-illumination image sensor, similarly to the unit pixel 100-11 illustrated in FIG. 16.

In comparison between the unit pixel 100-12 illustrated in FIG. 17 and the unit pixel 100-11 illustrated in FIG. 16, the unit pixel 100-12 has a configuration in which the on-chip lens 301-3 formed on the second opto-electronic converter 103 in the unit pixel 100-11 is removed, differently from the unit pixel 100-11 and the other parts in the unit pixel 100-12 are the same as the parts in the unit pixel 100-11.

The on-chip lens 301-3 is not formed on the second opto-electronic converter 103. Thus, light is not collected on the second opto-electronic converter 103 and enters the second opto-electronic converter 103. This reduces the light entering the second opto-electronic converter 103. Thus lowering the sensitivity of the second opto-electronic converter 103 and extending the dynamic range.

(Thirteenth Configuration of Unit Pixel)

Figure 18:
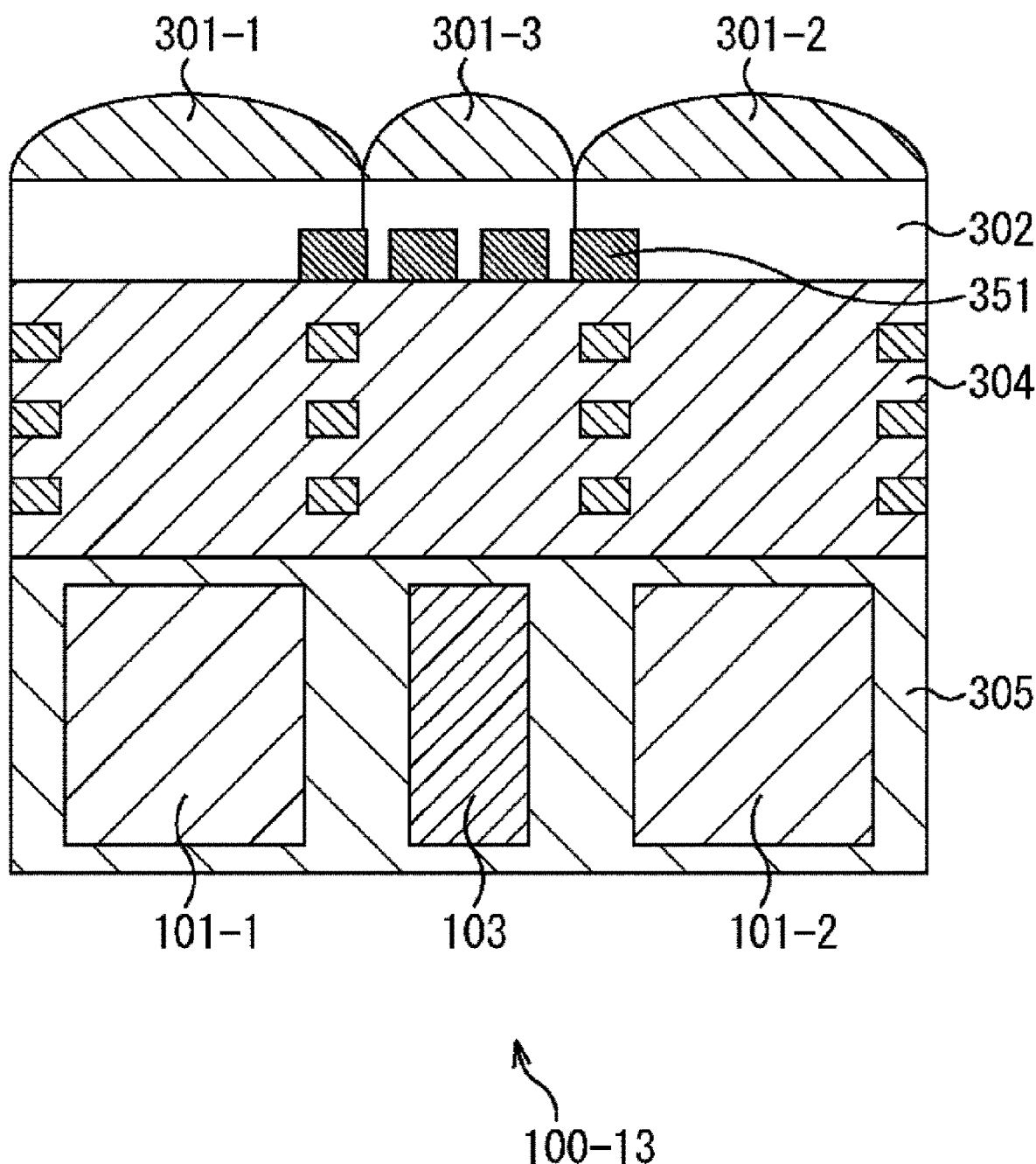
FIG. 18 is an explanatory diagram of a thirteenth configuration of a pixel.

Next, the thirteenth configuration of the unit pixel 100 will be described. FIG. 18 is a cross-sectional view of a unit pixel 100-13 when the CMOS image sensor 10 is a frontside-illumination image sensor, similarly to the unit pixel 100-9 illustrated in FIG. 14.

In comparison between the unit pixel 100-13 illustrated in FIG. 18 and the unit pixel 100-9 illustrated in FIG. 14, the unit pixel 100-13 has a configuration in which the light-blocking film 351 of the unit pixel 100-13 has a different shape from the light-blocking film 303 of the unit pixel 100-9, differently from the unit pixel 100-9, and the other parts of the unit pixel 100-13 are the same as the parts of the unit pixel 100-9. The light-blocking film 351 of the unit pixel 100-13 has a slit shape and formed in the layer of the colored filter 302.

Forming a slit on the light-blocking film 351 can cause the light-blocking film 351 to work as a polarizer and the second opto-electronic converter 103 to a polarization pixel.

Also in this configuration, forming the light-blocking film 351 on the low-sensitivity second opto-electronic converter 103 reduces the light entering the second opto-electronic converter 103. Thus lowering the sensitivity, which can extend the dynamic range. Additionally, forming a slit on the light-blocking film 351 can cause the light-blocking film 351 to work as a polarizer so as to remove the effect of unnecessary light such as the reflected light.

(Fourteenth Configuration of Unit Pixel)

Figure 19:
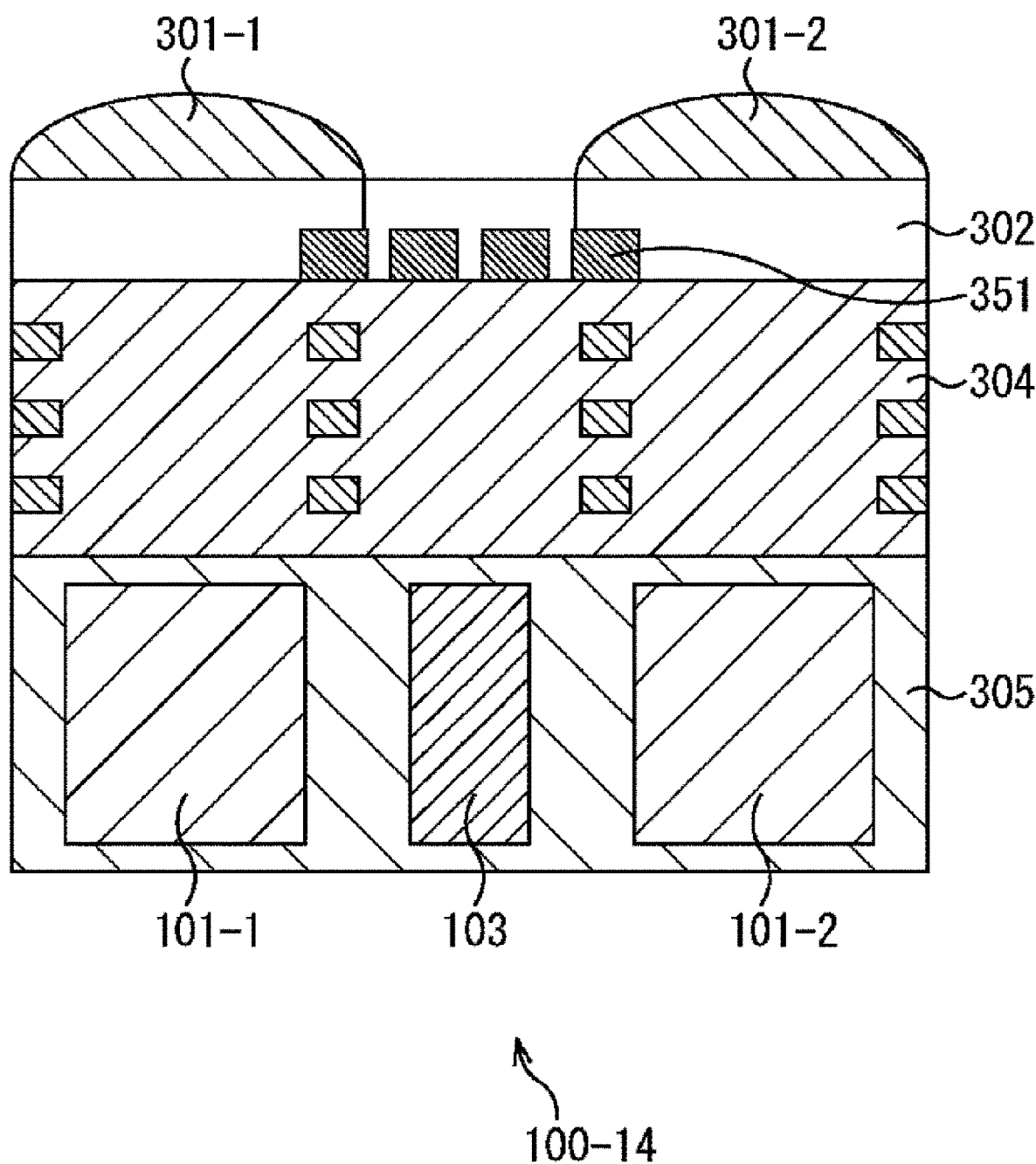
FIG. 19 is an explanatory diagram of a fourteenth configuration of a pixel.

Next, the fourteenth configuration of the unit pixel 100 will be described. FIG. 19 is a cross-sectional view of a unit pixel 100-14 when the CMOS image sensor 10 is a frontside-illumination image sensor, similarly to the unit pixel 100-13 illustrated in FIG. 18.

In comparison between the unit pixel 100-14 illustrated in FIG. 19 and the unit pixel 100-13 illustrated in FIG. 18, the unit pixel 100-14 has a configuration in which the on-chip lens 301-3 formed on the second opto-electronic converter 103 in the unit pixel 100-13 is removed, differently from the unit pixel 100-13 and the other parts in the unit pixel 100-14 are the same as the parts in the unit pixel 100-13. The light-blocking film 351 of the unit pixel 100-14 has a slit, and formed in the layer of the colored filter 302.

The on-chip lens 301-3 is not formed on the second opto-electronic converter 103. Thus, light is not collected on the second opto-electronic converter 103 and enters the second opto-electronic converter 103. This reduces the light entering the second opto-electronic converter 103. This further reduces the sensitivity of the second opto-electronic converter 103. Thus, the dynamic range can be extended. Additionally, forming a slit on the light-blocking film 351 can cause the light-blocking film 351 to work as a polarizer so as to remove the effect of unnecessary light such as the reflected light.

(Fifteenth Configuration of Unit Pixel)

Figure 20:
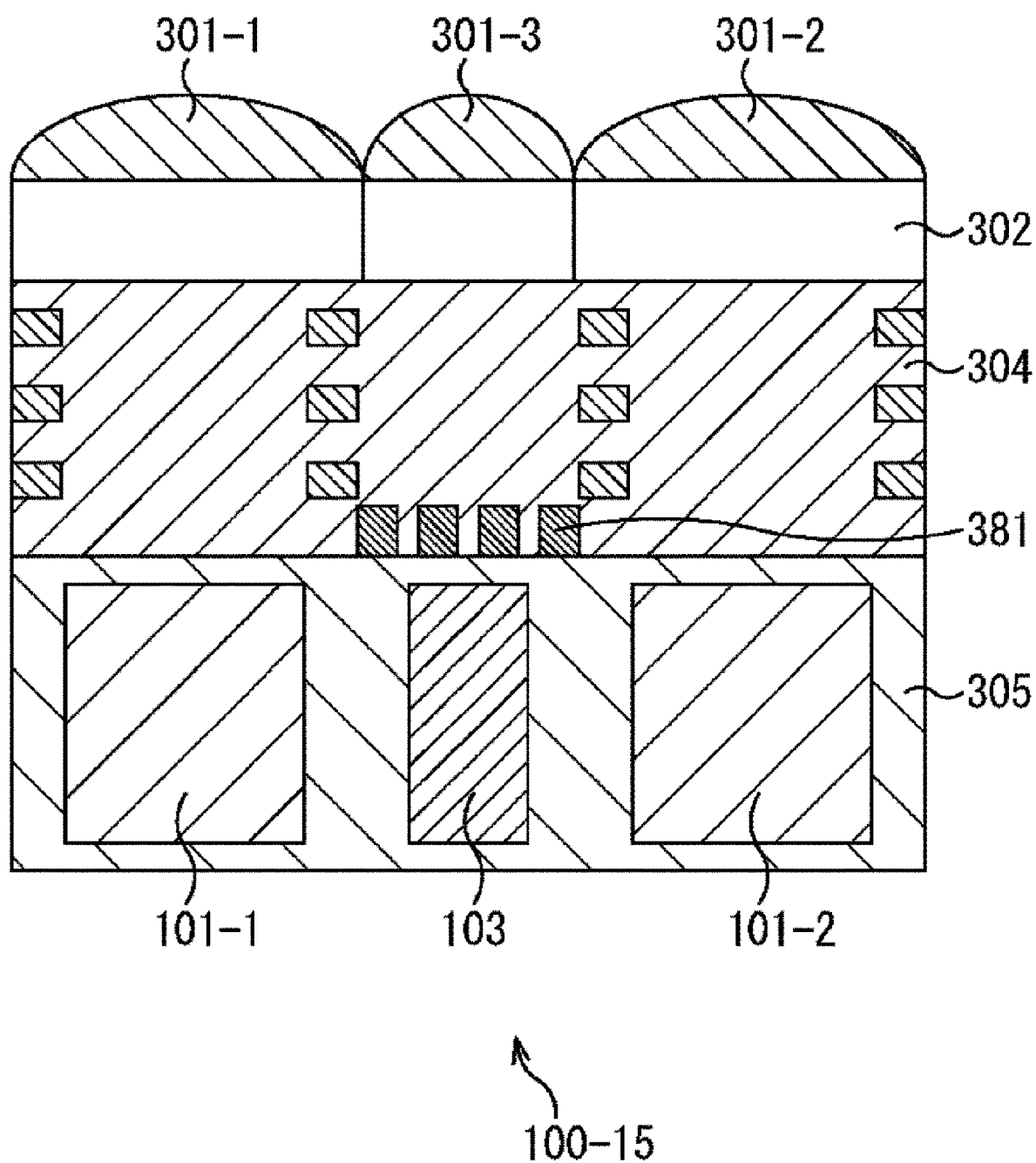
FIG. 20 is an explanatory diagram of a fifteenth configuration of a pixel.

Next, the fifteenth configuration of the unit pixel 100 will be described. FIG. 20 is a cross-sectional view of a unit pixel 100-15 when the CMOS image sensor 10 is a frontside-illumination image sensor, similarly to the unit pixel 100-13 illustrated in FIG. 18.

In comparison between the unit pixel 100-15 illustrated in FIG. 20 and the unit pixel 100-13 illustrated in FIG. 18, the light-blocking film 351 is formed on the upper side of the wiring layer 304 in the drawing in the unit pixel 100-13 while the light-blocking film 381 is formed on the lower side of the wiring layer 304 in the drawing in the unit pixel 100-15. The other parts in the unit pixel 100-15 are the same as the parts in the unit pixel 100-13. In other words, the light-blocking film 381 of the unit pixel 100-15 has a slit, and is formed on the lower side of the wiring layer 304 in the drawing in the unit pixel 100-15.

Also in the front-side illumination image sensor having this configuration, forming the light-blocking film 381 on the low-sensitivity second opto-electronic converter 103 causes the light-blocking film 381 to absorb the light passing through the on-chip lens 301-3 and reduces the light entering the second opto-electronic converter 103. Thus lowering the sensitivity of the second opto-electronic converter 103, which can extend the dynamic range. Additionally, forming a slit on the light-blocking film 381 can cause the light-blocking film 351 to work as a polarizer so as to remove the effect of unnecessary light such as the reflected light.

(Sixteenth Configuration of Unit Pixel)

Figure 21:
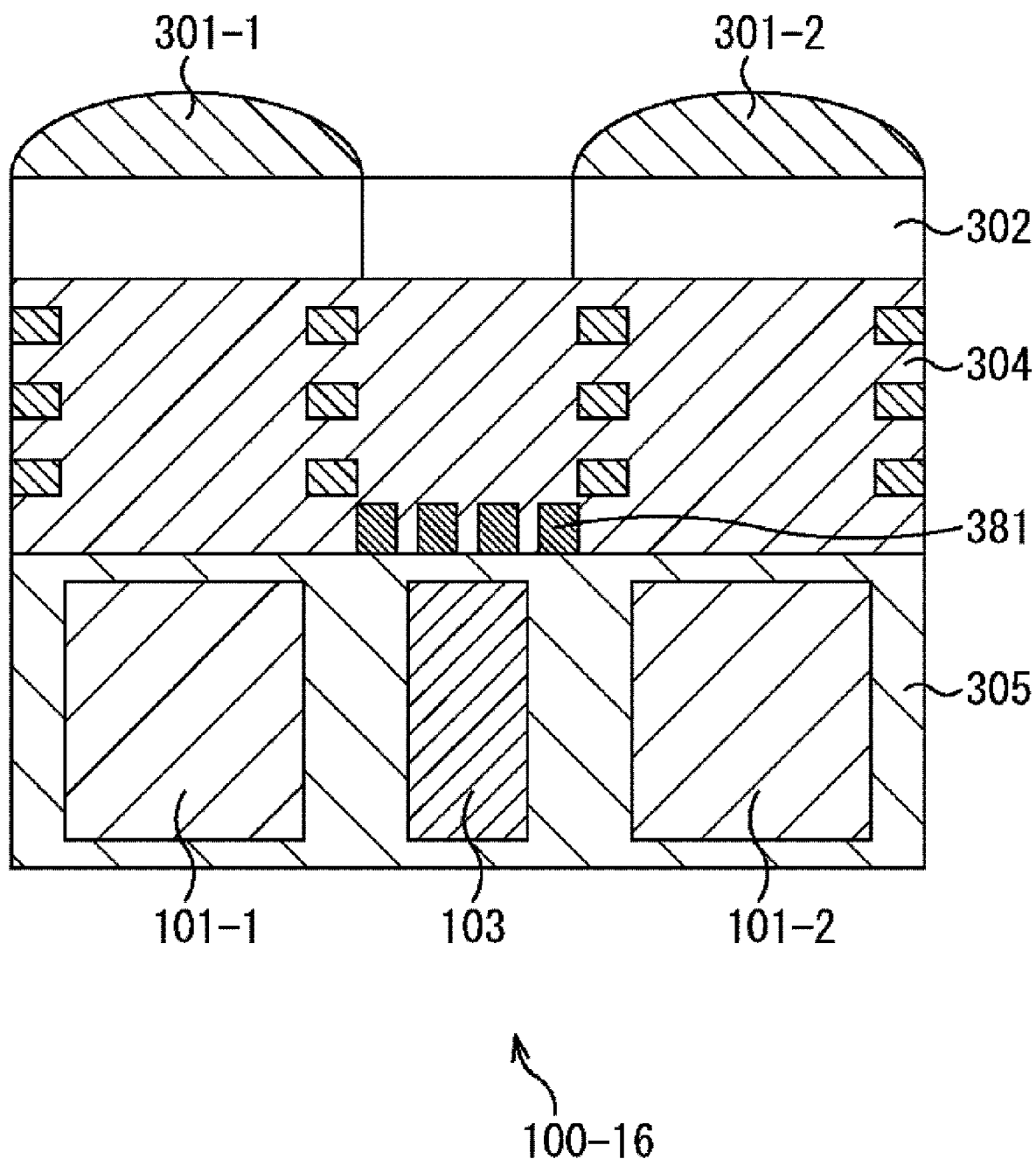
FIG. 21 is an explanatory diagram of a sixteenth configuration of a pixel.

Next, the sixteenth configuration in the unit pixel 100 will be described. FIG. 21 is a cross-sectional view of a unit pixel 100-16 when the CMOS image sensor 10 is a frontside-illumination image sensor, similarly to the unit pixel 100-15 illustrated in FIG. 20.

In comparison between the unit pixel 100-16 illustrated in FIG. 21 and the unit pixel 100-15 illustrated in FIG. 20, the unit pixel 100-16 has a configuration in which the on-chip lens 301-3 formed on the second opto-electronic converter 103 in the unit pixel 100-15 is removed, differently from the unit pixel 100-15 and the other parts in the unit pixel 100-16 are the same as the parts in the unit pixel 100-15. In other words, the light-blocking film 381 of the unit pixel 100-16 has a slit and is formed on the lower side of the wiring layer 304.

The on-chip lens 301-3 is not formed on the second opto-electronic converter 103. Thus, light is not collected on the second opto-electronic converter 103 and enters the second opto-electronic converter 103. This reduces the light entering the second opto-electronic converter 103. Thus lowering the sensitivity of the second opto-electronic converter 103, which can extend the dynamic range. Additionally, forming a slit on the light-blocking film 381 can cause the light-blocking film 381 to work as a polarizer so as to remove the effect of unnecessary light such as the reflected light.

As described in the first to sixteenth configurations, a film having a function to absorb light is formed on the low-sensitivity second opto-electronic converter 103. This reduces the amount of light entering the second opto-electronic converter 103. Thus, lowering the sensitivity can extend the dynamic range.

Additionally, forming a slit on the light-blocking film can cause the light-blocking film to work as a polarizer. Providing the polarizer removes the effect of the reflected light (the effect of unnecessary light) and simultaneously, lowering the sensitivity, which can extend the dynamic range.

Using the light-blocking film as the polarizer can effectively reduce the direct or indirect light in comparison with using a polarizer made of metal.

<Arrangement of First and Second Opto-electronic Converters>

Figure 22:
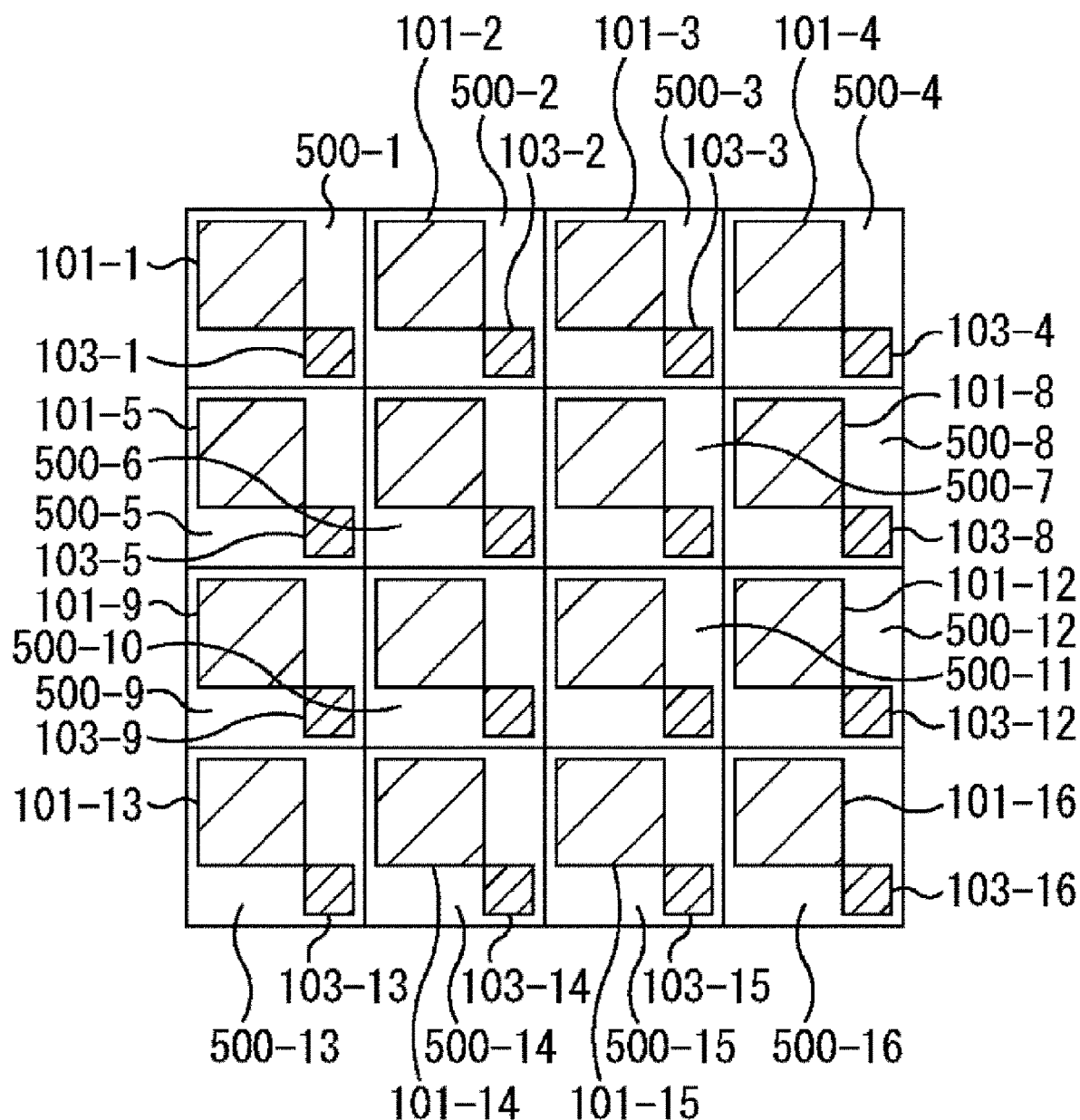
FIG. 22 is an explanatory diagram of an arrangement of pixels having different sensitivities.

The unit pixels 100, each of which includes a first opto-electronic converter 101 and a second opto-electronic converter 103, are arranged, for example, as illustrated in FIG. 22. In FIG. 22, the unit pixels are referred to as unit pixels 500. A unit pixel 500 will be described as one of the unit pixels 100-1 to 100-18.

FIG. 22 illustrates an example in which (four by four) 16 unit pixels 500-1 to 500-16 are arranged. Each unit pixel 500 includes a first opto-electronic converter 101 and a second opto-electronic converter 103. For example, the unit pixel 500-1 includes a first opto-electronic converter 101-1 and a second opto-electronic converter 103-1.

The first opto-electronic converter 101 and the second opto-electronic converter 103 have different sensitivities depending on the size of the light-receiving surface. In other words, as illustrated in FIG. 22, the light-receiving surface of the first opto-electronic converter 101 is larger than the light-receiving surface of the second opto-electronic converter 103.

In the example of FIG. 22, for example, the second opto-electronic converter 103-1 of a unit pixel is placed on the right and obliquely lower side of the first opto-electronic converter 101-1 of that unit pixel. Although not illustrated, the second opto-electronic converter 103-1 can be placed on the right side of the first opto-electronic converter 101-1. Alternatively, the positional relationship between the second opto-electronic converter 103-1 and the first opto-electronic converter 101-1 can be different from the above. For example, at least a portion of a side of the second opto-electronic converter 103-1 can coincide with or can be adjacent to a portion of a side of the first opto-electronic converter 101-1.

In the unit pixel 500, for example, a signal process circuit can be placed at a part at which the first opto-electronic converter 101 and the second opto-electronic converter 103 are not arranged. In other words, arranging the first opto-electronic converter 101 and second opto-electronic converter 103 with different light-receiving areas causes an excessive region in the unit pixel 500. However, placing, for example, a signal process circuit in the excessive region can effectively use the excessive region.

Figure 23:
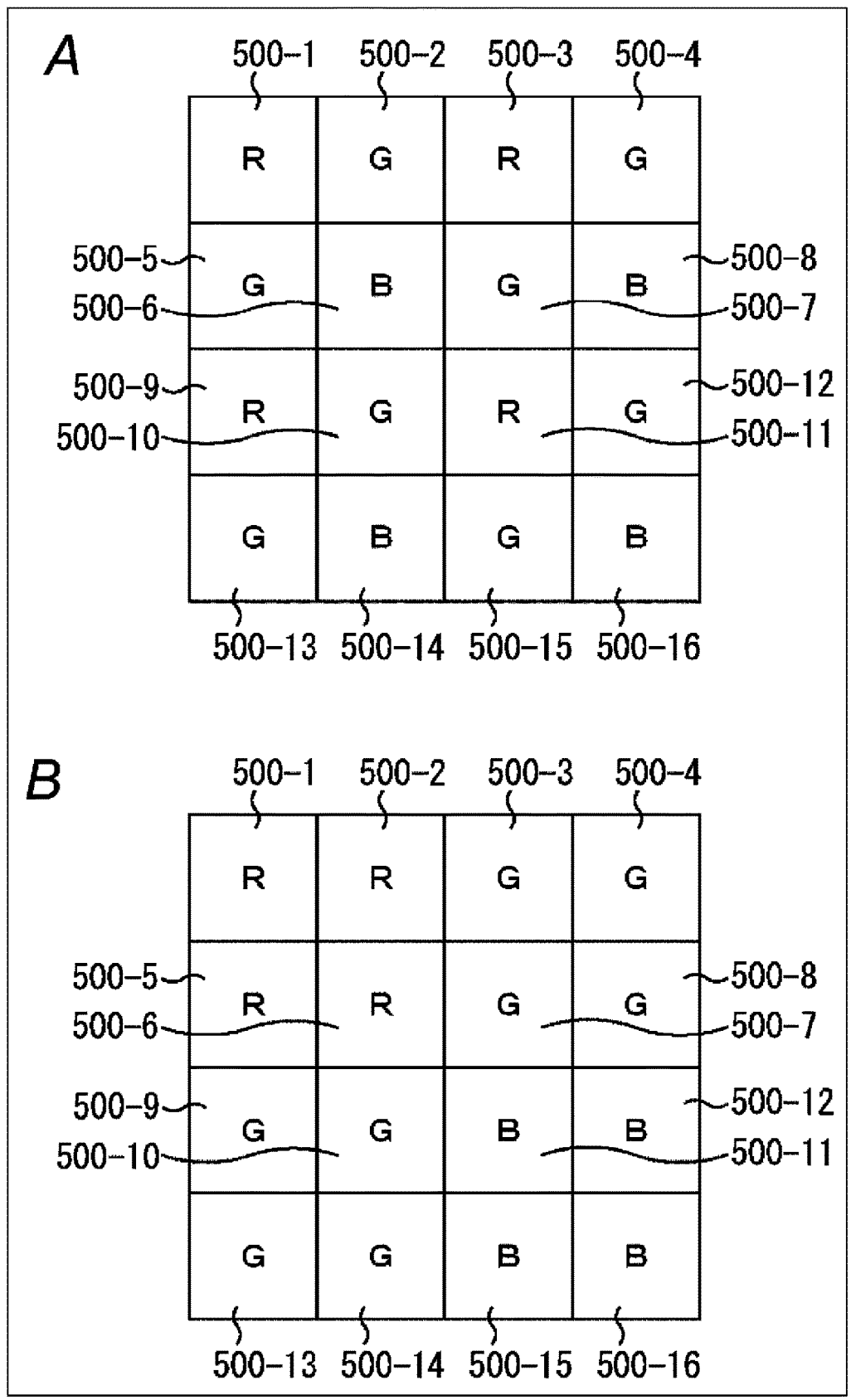
FIGS. 23-B are explanatory diagrams of an arrangement of colors.

The colors of the colored filters 202 (302) placed on the unit pixels 500 can be arranged, for example, in Bayer arrangement. As illustrated in FIG. 23A, the unit pixel 500-1 can be red (R), the unit pixel 500-2 can be green (G), the unit pixel 500-5 can be green (G), and the unit pixel 500-6 can be blue (B).

In the color arrangement described above, with reference to FIGS. 22 and 23A again, for example, the first opto-electronic converter 101-1 and the second opto-electronic converter 103-1 are arranged and the color of the colored filter 202 (or 302, hereinafter, the colored filter 202 is cited as an example for the description) is red (R) in the unit pixel 500-1. As described above, the first opto-electronic converter 101 and second opto-electronic converter 103 arranged in the same unit pixel 500 have the color of the same colored filter 202.

As illustrated in FIG. 23B, the colors can be arranged in Bayer arrangement in which four pixels have the same color. In FIG. 23B, the unit pixel 500-1, the unit pixel 500-2, the unit pixel 500-5, and the unit pixel 500-6 are red (R); the unit pixel 500-3, the unit pixel 500-4, the unit pixel 500-7, and the unit pixel 500-8 are green (G); the unit pixel 500-9, the unit pixel 500-10, the unit pixel 500-13, and the unit pixel 500-14 are green (G); and the unit pixel 500-11, the unit pixel 500-12, the unit pixel 500-15, and the unit pixel 500-16 are green (G).

In this example, Bayer arrangement is cited as an example of the color arrangement. However, the present technology can be used for another color arrangement.

A light-blocking film is formed on the second opto-electronic converter 103 as described above. The light-blocking film is the light-blocking film 203 without a slit illustrated, for example, in FIG. 6 (hereinafter, referred to as a solid light-blocking film 203), or the light-blocking film 251 with a slit illustrated, for example, in FIG. 10.

Note that, although the light-blocking film 203 (FIG. 6) will be cited as an example of the solid light-blocking film for the description hereinafter, the description can be applied to the light-blocking film 303 (FIG. 14) and the light-blocking film 331 (FIG. 16). Additionally, the light-blocking film 251 (FIG. 10) will be cited as an example of the slit light-blocking film for the description hereinafter. However, the description can be applied to the light-blocking film 351 (FIG. 18) and the light-blocking film 381 (FIG. 20).

Figure 24:
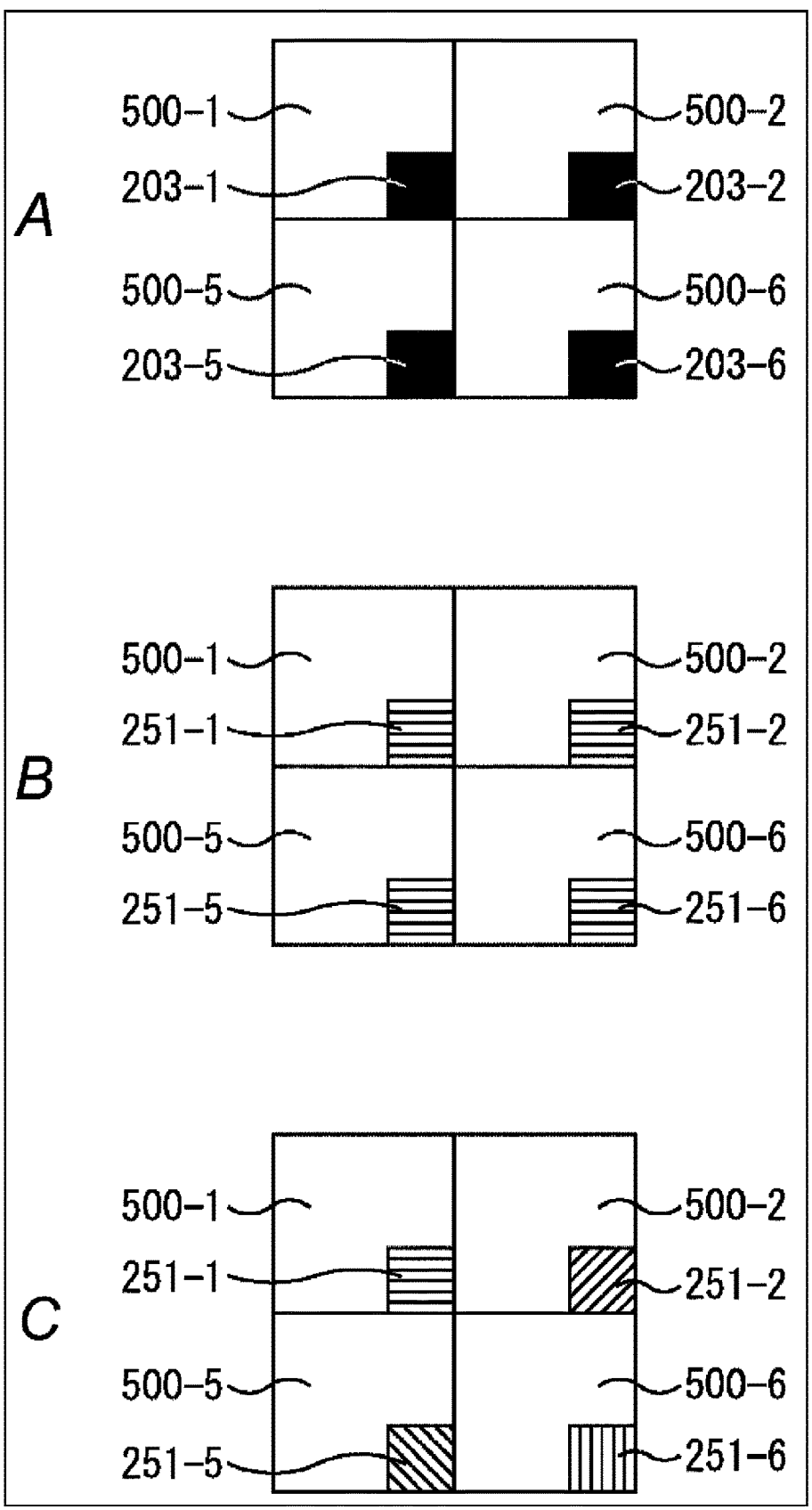
FIGS. 24A-C are explanatory diagrams of an arrangement of light-blocking films.

When the solid light-blocking films 203 are formed on the unit pixel, the light-blocking film 203 are formed, for example, as illustrated in FIG. 24A. FIG. 24A only illustrates left and upper four pixels among the (four by four) 16 unit pixels 500-1 to 500-16 illustrated in FIG. 22. However, the light-blocking films 203 are similarly formed on the other pixels.

As illustrated in FIG. 24A, the solid light-blocking films 203 are formed on the second opto-electronic converters 103 in the unit pixels 500. For example, the second opto-electronic converter 103 is formed on the right and lower side of the unit pixel 500-1 illustrated in FIG. 24A, and a light-blocking film 203-1 is formed in the region in which the second opto-electronic converter 103-1 is formed.

Note that, as illustrated in FIG. 24A, the light-blocking film 203 can be formed so that the light-blocking film 203 is connected to a well (WELL) in an outer peripheral region of the pixel.

When the slit light-blocking films 251 are formed on the unit pixels, the light-blocking film 251 are formed, for example, as illustrated in FIG. 24B. As illustrated in FIG. 24B, the slit light-blocking films 251 are formed on the second opto-electronic converters 103 in the unit pixels 500, respectively.

The slits illustrated in FIG. 24B extend in the lateral direction of the drawing and all the four pixels have slits extending in the same direction. As described above, the slits on the light-blocking films 251 provided on the second opto-electronic converters 103 can be formed in the same direction.

The direction in which the slits are arranged on the light-blocking films 251 can be varied depending on the pixel. FIG. 24C illustrates that the light-blocking films 251 are formed on the second opto-electronic converters 103 in the unit pixels 500, respectively, and the slits of the light-blocking films 251 with slits are formed in different directions depending on the pixel.

The slits on the light-blocking film 251-1 formed on the second opto-electronic converter 103-1 in the unit pixel 500-1 illustrated in FIG. 24C are formed in the lateral direction of the drawing. The slits on the light-blocking film 251-2 formed on the second opto-electronic converter 103-2 in the unit pixel 500-2 are formed in a direction toward the left and obliquely toward the lower side of the drawing.

The slits on the light-blocking film 251-5 formed on the second opto-electronic converter 103-5 in the unit pixel 500-5 are formed in a direction toward the right and obliquely toward the lower side of the drawing. The slits on the light-blocking film 251-6 formed on the second optoelectronic converter 103-6 in the unit pixel 500-6 are formed in the longitudinal direction of the drawing.

In the example illustrated in FIG. 24C, the slits are formed in the four directions. Similarly, in the other pixels (not illustrated), the slits are formed on the light-blocking films 251 so that the slits are formed in four different directions in (two by two) four pixels depending on the pixel. Note that, although the four directions are cited as an example in this example, another direction can be added or, for example, the slits can be formed in two or three directions. The number of directions in which the slits are formed on the light-blocking films 251 are not limited to four.

Forming the slits in different directions pixel by pixel as described above, in other words, varying the directions in which the slits are formed on the light-blocking films 251 formed on the adjacent second opto-electronic converters 103 pixel by pixel can block the polarized light from different directions.

Additionally, when the direction in which the slits are formed varies depending on the pixel as described above, for example, when the slits are formed in different directions in the four pixels illustrated in FIG. 24C, respectively, the four unit pixels can have the same color. In other words, the colors can be arranged in Bayer arrangement in which the four pixels have the same color as illustrated in FIG. 23B, and the slits can be formed in different directions in the four pixels having the same color, respectively.

<Exemplary Variation>

An example in which two opto-electronic converters with different sensitivities are arranged in a pixel has been described above. However, three or more opto-electronic converters with different sensitivities can be arranged in a pixel. The difference of the sensitivities can be adjusted by changing the material or thickness of the light-blocking film.

Additionally, an example in which the present technology is applied to a CMOS image sensor having unit pixels arranged in rows and columns has been described in the embodiments. However, the application of the present technology is not limited to the application to a CMOS image sensor. In other words, the present technology can be applied to all of image pick-up apparatuses in which unit pixels are two-dimensionally in rows and columns in an X-Y address scheme.

Furthermore, the present technology can be applied not only to an image pick-up apparatus that detects the distribution of visible incident lights and captures the lights as an image but also to all the image pick-up apparatuses that capture the distribution of incoming infrared rays, X-rays, or particles as an image.

Note that the image pick-up apparatus can be formed as a chip, or can be formed as a module having an image pick-up function in which an image pick-up unit and a signal processing unit or an optical system are packaged.

<Exemplary Usage of Image Pick-Up Apparatus>

Figure 25:
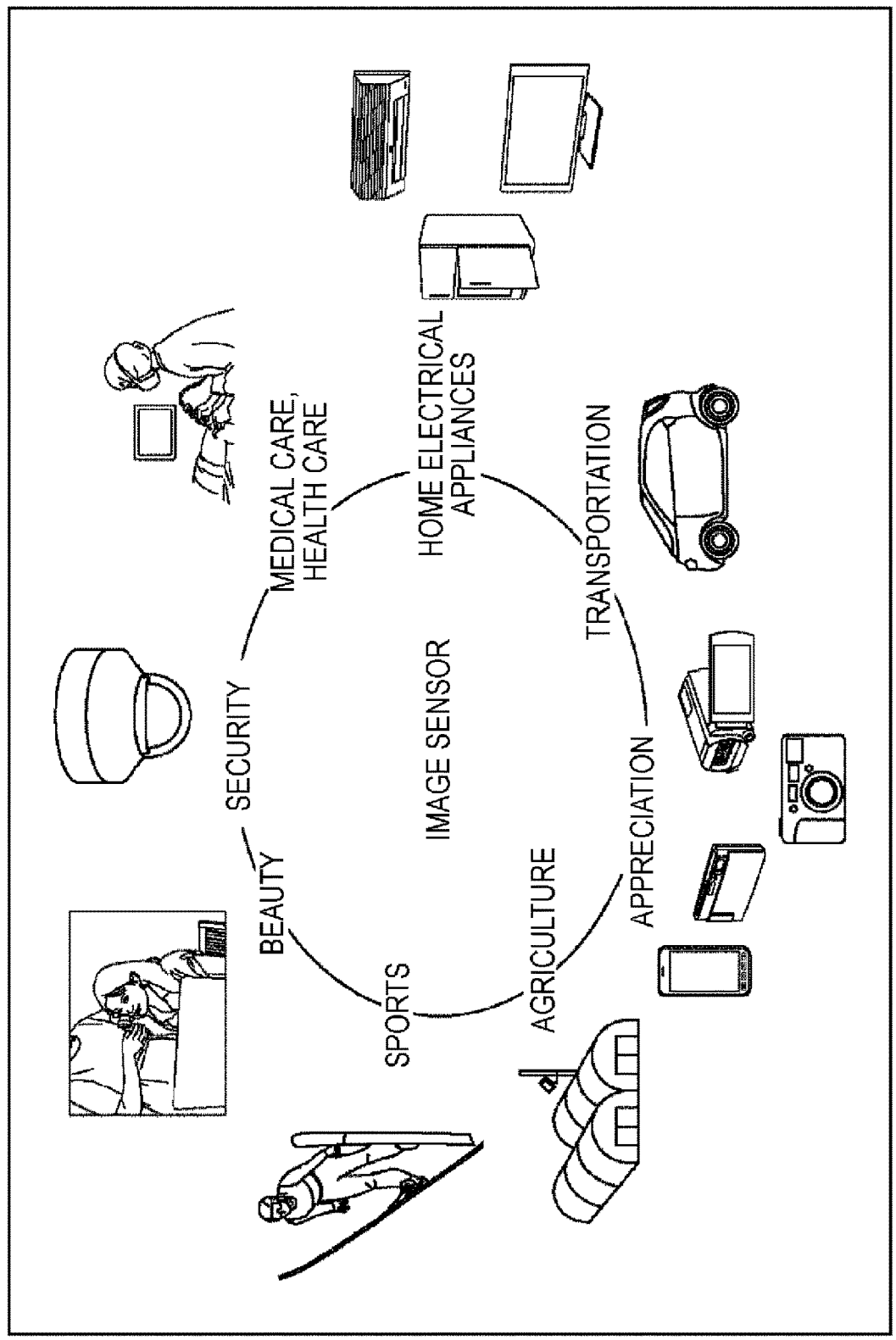
FIG. 25 is a diagram of exemplary uses of the image pick-up apparatus.

FIG. 25 is a diagram of exemplary uses of the image pick-up apparatus.

The image pick-up apparatus can be used for various purposes in which lights including visible lights, infrared rays, ultraviolet lights, or X rays are sensed as described below.

An apparatus that captures an image for appreciation, such as a digital camera, or a mobile phone with a camera function.

An apparatus used for traffic purposes, such an in-vehicle sensor that captures an image of the view in front of, around, behind, or in the car for safe driving including automatic stop and recognition of the driver's condition, a monitoring camera that monitors running vehicles, or roads, or a distance measurement sensor that measures the distance between the vehicle and another vehicle.

An apparatus used for home electrical appliances including a TV, a refrigerator, and an air conditioner. The apparatus captures an image of the user's gesture to control the appliance in accordance with the gesture.

An apparatus used for medical care or health care, such as an endoscope or a device that captures an image of vessels by receiving infrared lights.

An apparatus used for security, such as a monitoring camera for security or a camera used for personal verification.

An apparatus used for cosmetic purposes, such as a skin condition measurement device that captures an image of skin, or a microscope takes an image of the scalp.

An apparatus used for sport, such as an action camera or a wearable camera for sports.

An apparatus used for agricultural purposes, such as a camera that monitors fields and crops.

Figure 26:
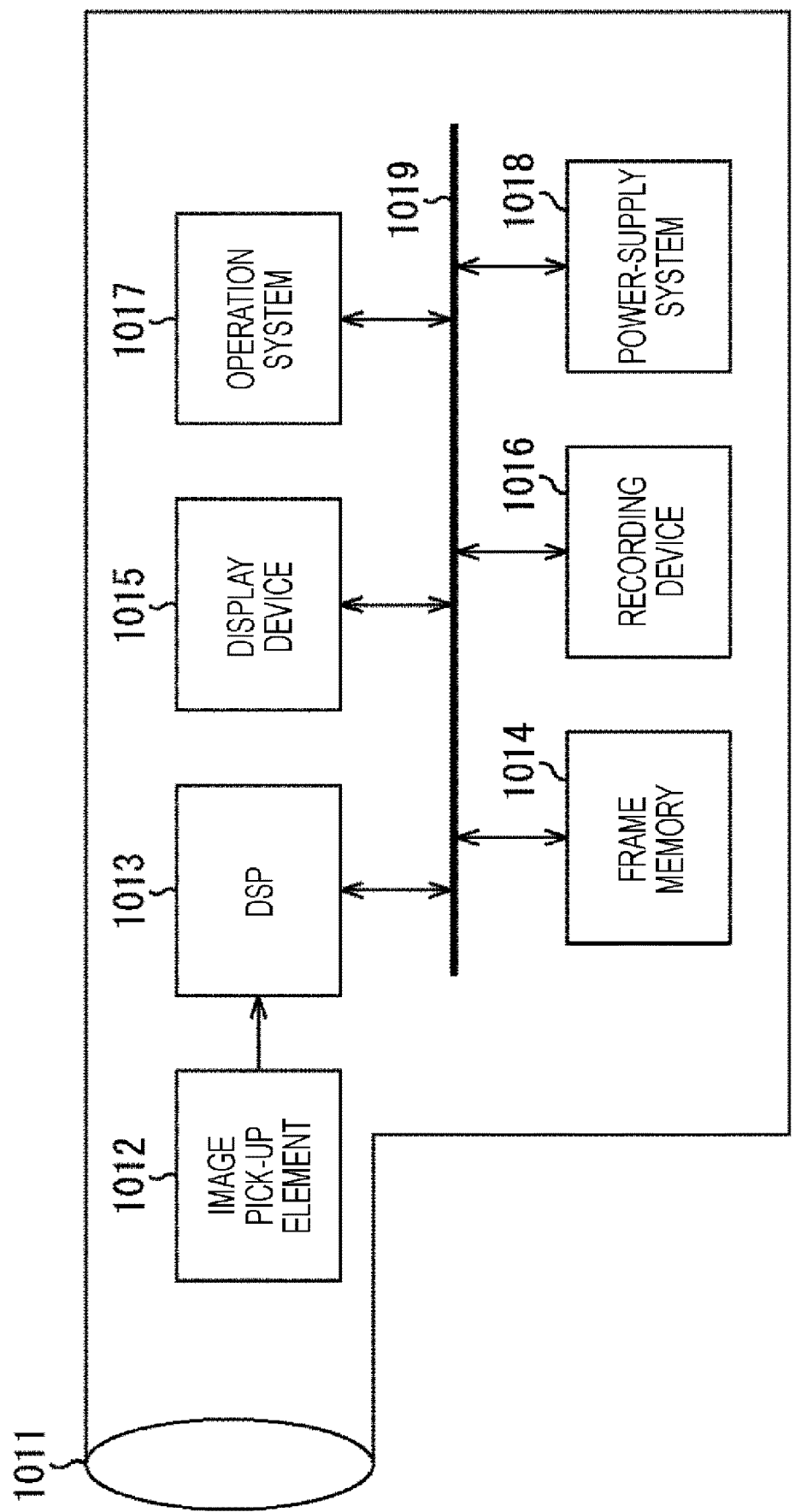
FIG. 26 is a diagram of a configuration of the image pick-up apparatus.

FIG. 26 is a block diagram of an exemplary configuration of an image pick-up apparatus (camera device) 1001 that is an exemplary electronic device using the present technology.

As illustrated in FIG. 26, the image pick-up apparatus 1001 includes, for example, an optical system including a lens group 1011, an image pick-up element 1012, a DSP 1013 that is a camera signal processing unit, a frame memory 1014, a display device 1015, a recording device 1016, an operation system 1017, and a power-supply system 1018. The DSP 1013, the frame memory 1014, the display device 1015, the recording device 1016, the operation system 1017, and the power-supply system 1018 are connected to each other via a bus line 1019.

The lens group 1011 captures the incident light (image light) from an object and forms an image on the image pick-up surface of the image pick-up element 1012. The image pick-up element 1012 converts the amount of incident light with which the lens group 1011 forms an image on the image pick-up surface into electric signals pixel by pixel so as to output the electric signals as pixel signals.

The display device 1015 includes a panel display device such as a liquid crystal display device or an organic electro luminescence (EL) display device so as to display the video or still image captured by the image pick-up element 1012. The recording device 1016 records the video or still image captured by the image pick-up element 1012 onto a recording medium such as a memory card, a videotape, or a Digital Versatile Disk (DVD).

The operation system 1017 issues instructions for the operation of various functions of the image pick-up apparatus 1001 under the control by the user. The power-supply system 1018 properly supplies various power sources as the power sources of the operation of the DSP 1013, the frame memory 1014, the display device 1015, the recording device 1016, and the operation system 1017.

The image pick-up apparatus 1001 described above is applied to a video camera, or a digital still camera, additionally, to a camera module for a mobile device such as a smartphone, or a mobile phone. The image pick-up apparatus 1001 can use the image pick-up apparatus described in each of the embodiments described above as the image pick-up element 1012. This can improve the image quality of images captured by the image pick-up apparatus 1001.

Herein, the system means the whole of an apparatus including a plurality of devices.

Note that the effects described herein are merely examples. The effects of the present technology are not limited to the described effects and can include another effect.

Note that the embodiments of the present technology are not limited to the embodiments described above and can variously be changed without departing from the gist of the present technology.

Note that the present technology can have the following configurations.

(1)

An image pick-up apparatus including:

a pixel array unit, a plurality of unit pixels being arranged in the pixel array unit, the unit pixel including a first opto-electronic converter, and a second opto-electronic converter having a sensitivity lower than a sensitivity of the first opto-electronic converter, the second opto-electronic converter including a light-blocking film formed on a side of the second opto-electronic converter from which light enters the second opto-electronic converter.

(2)

The image pick-up apparatus according to (1), wherein a lens used to collect light entering the second opto-electronic converter is not formed on the second opto-electronic converter.

(3)

The image pick-up apparatus according to (1) or (2), wherein a light-blocking wall used to prevent light from leaking from an opto-electronic converter into opto-electronic converters next to the opto-electronic converter is provided between the opto-electronic converters.

(4)

The image pick-up apparatus according to any of (1) to (3), wherein the light-blocking film has a slit.

(5)

The image pick-up apparatus according to (4), wherein directions in which slits are formed on light-blocking films formed on the adjacent second opto-electronic converters are different.

(6)

The image pick-up apparatus according to any of (1) to (5), being a backside-illumination image sensor.

(7)

The image pick-up apparatus according to any of (1) to (5), being a frontside-illumination image sensor.

(8)

The image pick-up apparatus according to (7), wherein the light-blocking film is formed on a lower or upper side of a wiring layer formed on the second opto-electronic converter.

(9)

The image pick-up apparatus according to any of (1) to (8), wherein the light-blocking film is an amorphous silicon film, a polysilicon film, a Ge film, a GaN film, a CdTe film, a GaAs film, an InP film, a CuInSe2 film, Cu2S, a CIGS film, a non-conductive carbon film, a black resist film, an organic opto-electronic conversion film, or a metal film.

(10)

An imaging device, comprising:

a substrate;

a first opto-electronic converter having a first area formed in the substrate;

a second opto-electronic converter having a second area formed in the substrate, wherein the first area is larger than the second area;

a trench extending from a first surface of the substrate, wherein at least a portion of the trench is between the first opto-electronic converter and the second opto-electronic converter.

(11)

The imaging device according to (10), wherein the first and second areas are parallel to the first surface of the substrate.

(12)

The imaging device according to (10) or (11), wherein the first and second areas correspond to light-receiving surfaces of the first and second opto-electronic converters respectively.

(13)

The imaging device according to any of (10) to (12), wherein the first opto-electronic converter has a higher sensitivity than the second opto-electronic converter.

(14)

The imaging device according to any of (10) to (13), further comprising a pixel separation region between the first and second opto-electronic converters, wherein the trench is formed in the pixel separation region.

(15)

The imaging device according to any of (10) to (14), wherein a light-blocking wall is formed in the trench and includes an insulating film extending from the first surface of the substrate.

(16)

The imaging device according to any of (10) to (15), wherein a light-blocking wall is formed in the trench, and wherein the light-blocking wall includes at least one of a negative fixed charge film, an oxide film, and a metal.

(17)

The imaging device according to any of (10) to (16), further comprising a light-blocking film, wherein the light-blocking film is formed over at least a portion of the second area of the second opto-electronic converter, wherein the light-blocking film absorbs a portion of light incident on the imaging device.

(18)

The imaging device according to any of (10) to (17), wherein the light-blocking film overlaps the trench.

(19)

The imaging device according to any of (10) to (18), wherein the light-blocking film overlaps a portion of the first opto-electronic converter.

(20)

The imaging device according to any of (10) to (19), further comprising an on-chip lens formed over the first area of the opto-electronic converter, wherein no on-chip lens is formed over the second area of the second opto-electronic converter.

(21)

The imaging device according to any of (10) to (20), further comprising a color filter, wherein the color filter extends across at least a portion of the first area of the first opto-electronic converter.

(22)

The imaging device according to any of (10) to (21), wherein the color filter extends across the light-blocking film.

(23)
The imaging device according to any of (10) to (22), wherein the light-blocking film includes a slit.
(24)
The imaging device according to any of (10) to (23), wherein the light-blocking film forms a polarizer.
(25)
The imaging device according to any of (10) to (24) further comprising a plurality of light-blocking walls, wherein the first opto-electronic converter extends from a first light-blocking wall to a second light-blocking wall to a third light-blocking wall.
(26)
The imaging device according to any of (10) to (25) further comprising a plurality of first opto-electronic converters, wherein the first opto-electronic converters are disposed in a plurality of rows and a plurality if columns;
a plurality of second opto-electronic converters, wherein the second opto-electronic converters are disposed in a plurality of rows and a plurality of columns, wherein a centerline of at least one of the rows of the plurality of first opto-electronic converters does not intersect any of the second optoelectronic converters, wherein a centerline of at least one of the rows of the plurality of second opto-electronic converters does not intersect any of the first optoelectronic converters, and wherein a line diagonal to at least one of the rows intersects at least one of the first opto-electronic converters and at least one of the second opto-electronic converters.
(27)
An imaging device, comprising:
a substrate;
a first opto-electronic converter;
a second opto-electronic converter having a sensitivity lower than a sensitivity of the first opto-electronic converter;
a trench extending from a first surface of the substrate, wherein at least a portion of the trench is between the first opto-electronic converter and the second opto-electronic converter.
(28)
An electronic apparatus, comprising:
an optical system;
an image pick-up element that receives light from the optical system, the image pick-up element, including:
a substrate;
a first opto-electronic converter having a first area formed in the substrate;
a second opto-electronic converter having a second area formed in the substrate, wherein the first area is larger than the second area;
a light-blocking wall extending from a first surface of the substrate, wherein at least a portion of the light-blocking wall is between the first opto-electronic converter and the second opto-electronic converter;
a digital signal processor that processes signals received from the image pick-up element.
(29)
The electronic apparatus according to (28), wherein the electronic apparatus is included in a vehicle.

REFERENCE SIGNS LIST

10 CMOS image sensor
11 Pixel array unit
12 Vertical drive unit
13 Column processing unit
14 Horizontal drive unit
15 System control unit
16 Pixel drive line
17 Vertical signal line
18 Signal processing unit
19 Data storage unit
100 Unit pixel
101 First opto-electronic converter
102 First transfer gate unit
103 Second opto-electronic converter
104 Second transfer gate unit
105 Third transfer gate unit
106 Charge accumulation unit
107 Reset gate unit
108 FD unit
109 Amplification transistor
110 Selection transistor
151 Fourth transfer gate unit
203, 251, 303, 331, 351, and 381 Light-blocking film

The invention claimed is:
1. An imaging device, comprising:
a substrate;
a first opto-electronic converter having a first area formed in the substrate;
a second opto-electronic converter having a second area formed in the substrate,
wherein the first area is larger than the second area;
a trench extending from a first surface of the substrate,
wherein at least a portion of the trench is between the first opto-electronic converter and the second opto-electronic converter; and
a light-blocking film,
wherein the light-blocking film is formed over at least a portion of the second area of the second opto-electronic converter,
wherein the light-blocking film absorbs a portion of light incident on the imaging device, and
wherein the light-blocking film includes a slit.
2. The imaging device of claim 1, wherein the first and second areas are parallel to the first surface of the substrate.
3. The imaging device of claim 1, wherein the first and second areas correspond to light-receiving surfaces of the first and second opto-electronic converters respectively.
4. The imaging device of claim 1, wherein the first opto-electronic converter has a higher sensitivity than the second opto-electronic converter.
5. The imaging device of claim 1, further comprising:
a pixel separation region between the first and second opto-electronic converters, wherein the trench is formed in the pixel separation region.
6. The imaging device of claim 1, wherein a light blocking wall is formed in the trench and includes an insulating film extending from the first surface of the substrate.
7. The imaging device of claim 1,
wherein a light blocking wall is formed in the trench, and
wherein the light blocking wall includes at least one of a negative fixed charge film, an oxide film, and a metal.
8. The imaging device of claim 1, wherein the light-blocking film overlaps the trench.
9. The imaging device of claim 1, wherein the light-blocking film overlaps a portion of the first opto-electronic converter.

10. The imaging device of claim 9, further comprising:
an on-chip lens formed over the first area of the first opto-electronic converter, wherein no on-chip lens is formed over the second area of the second opto-electronic converter.

11. The imaging device of claim 1, further comprising:
a color filter, wherein the color filter extends across at least a portion of the first area of the first opto-electronic converter.

12. The imaging device of claim 11, wherein the color filter extends across the light-blocking film.

13. The imaging device of claim 1, wherein the light-blocking film forms a polarizer.

14. The imaging device of claim 1, further comprising:
a plurality of light-blocking walls,
wherein the first opto-electronic converter extends from a first light blocking wall to a second light-blocking wall,
wherein the second opto-electronic converter extends from the second light-blocking wall to a third light blocking wall.

15. The imaging device of claim 1, further comprising:
a plurality of first opto-electronic converters,
wherein the first opto-electronic converters are disposed in a plurality of rows and a plurality of columns;
a plurality of second opto-electronic converters, wherein the second opto-electronic converters are disposed in a plurality of rows and a plurality of columns,
wherein a centerline of at least one of the rows of the plurality of first opto-electronic converters does not intersect any of the second optoelectronic converters,
wherein a centerline of at least one of the rows of the plurality of second opto-electronic converters does not intersect any of the first optoelectronic converters, and wherein a line diagonal to at least one of the rows intersects at least one of the first opto-electronic converters and at least one of the second opto-electronic converters.

16. An imaging device, comprising:
a substrate;
a first opto-electronic converter;
a second opto-electronic converter having a sensitivity lower than a sensitivity of the first opto-electronic converter;
a trench extending from a first surface of the substrate, wherein at least a portion of the trench is between the first opto-electronic converter and the second opto-electronic converter; and
a light-blocking film,
wherein the light-blocking film is formed over at least a portion of an area of the second opto-electronic converter,
wherein the light-blocking film absorbs a portion of light incident on the imaging device, and
wherein the light-blocking film includes a slit.

17. An electronic apparatus, comprising:
an optical system;
an image pick-up element that receives light from the optical system, the image pick-up element, including:
a substrate;
a first opto-electronic converter having a first area formed in the substrate;
a second opto-electronic converter having a second area formed in the substrate,
wherein the first area is larger than the second area;
a light-blocking wall extending from a first surface of the substrate,
wherein at least a portion of the light-blocking wall is between the first opto-electronic converter and the second opto-electronic converter; and
a light-blocking film,
wherein the light-blocking film is formed over at least a portion of the second area of the second opto-electronic converter,
wherein the light-blocking film absorbs a portion of light incident on the image pick-up element, and
wherein the light-blocking film includes a slit; and
a digital signal processor that processes signals received from the image pick-up element.

18. The electronic apparatus of claim 17, wherein the electronic apparatus is included in a vehicle.

* * * * *